United States Patent
Maglica et al.

(10) Patent No.: US 10,285,242 B2
(45) Date of Patent: *May 7, 2019

(54) PORTABLE LIGHTING DEVICES

(71) Applicant: Mag Instrument, Inc., Ontario, CA (US)

(72) Inventors: Anthony Maglica, Ontario, CA (US); Stacey West, Ontario, CA (US)

(73) Assignee: MAG INSTRUMENT, INC, Ontario, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/128,398

(22) Filed: Sep. 11, 2018

(65) Prior Publication Data

US 2019/0029095 A1    Jan. 24, 2019

Related U.S. Application Data

(63) Continuation of application No. 15/710,273, filed on Sep. 20, 2017, now Pat. No. 10,085,322, which is a continuation of application No. 15/370,794, filed on Dec. 6, 2016, now Pat. No. 9,801,256, which is a continuation of application No. 15/238,629, filed on Aug. 16, 2016, now Pat. No. 9,549,454, which is a continuation of application No. 14/642,607, filed on Mar. 9, 2015, now Pat. No. 9,447,951, which is a continuation of application No. 13/398,611, filed on Feb. 16, 2012, now Pat. No. 8,975,822, which is a continuation of application No. 12/188,233, filed on Aug. 8, 2008, now Pat. No. 8,134,300.

(51) Int. Cl.
H05B 37/02 (2006.01)
F21V 23/04 (2006.01)
F21V 23/00 (2015.01)
F21L 4/04 (2006.01)
F21V 19/04 (2006.01)
F21L 4/00 (2006.01)
G01R 19/165 (2006.01)

(52) U.S. Cl.
CPC .......... *H05B 37/0209* (2013.01); *F21L 4/005* (2013.01); *F21L 4/045* (2013.01); *F21V 19/047* (2013.01); *F21V 23/009* (2013.01); *F21V 23/0414* (2013.01); *F21V 23/0428* (2013.01); *H05B 37/02* (2013.01); *H05B 37/0281* (2013.01); *F21V 23/006* (2013.01); *G01R 19/16542* (2013.01); *Y10T 29/49828* (2015.01)

(58) Field of Classification Search
CPC ......... B23K 11/248; B60L 1/14; F21V 23/04; G05F 1/14; H05B 41/34; H05B 33/0803; H05B 39/09; H05B 41/28; H05B 33/0809; H05B 37/02; H05B 33/0842
See application file for complete search history.

(56) References Cited

U.S. PATENT DOCUMENTS 10,085,322 B2 * 9/2018 Maglica .................. F21L 4/005

* cited by examiner

Primary Examiner — Minh D A
(74) Attorney, Agent, or Firm — Roy L Anderson

(57) ABSTRACT

A method for increasing battery life in a lighting device powered by a battery source in which an electronic circuit is caused to provide a declining power supply to a light emitting diode ("LED") as a power profile of the battery source declines.

18 Claims, 16 Drawing Sheets

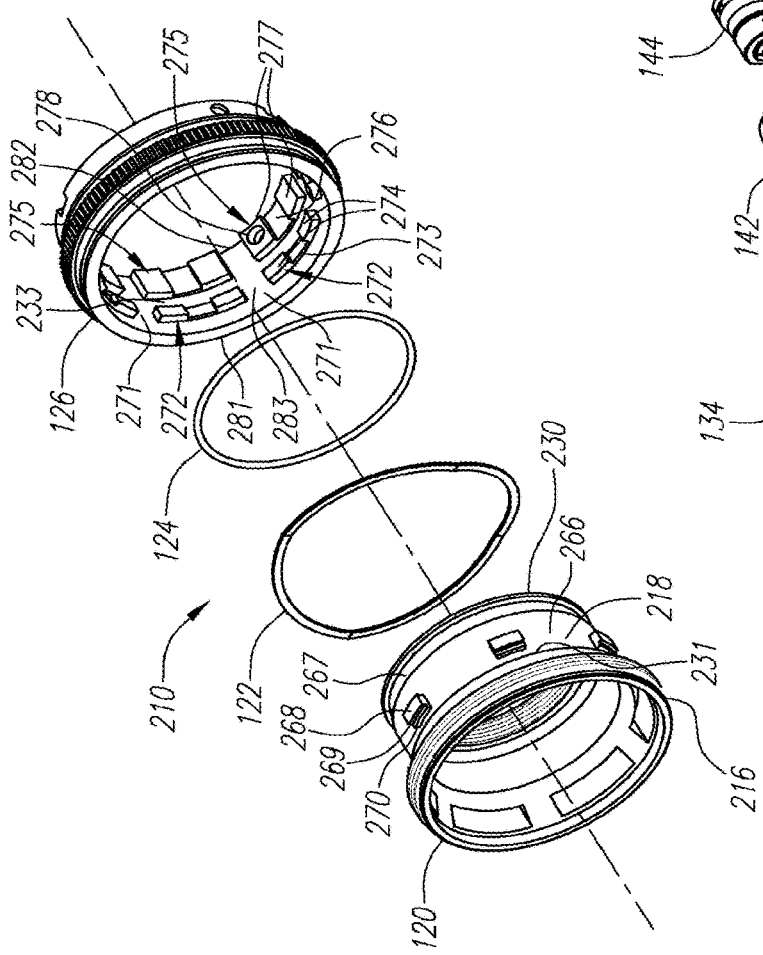
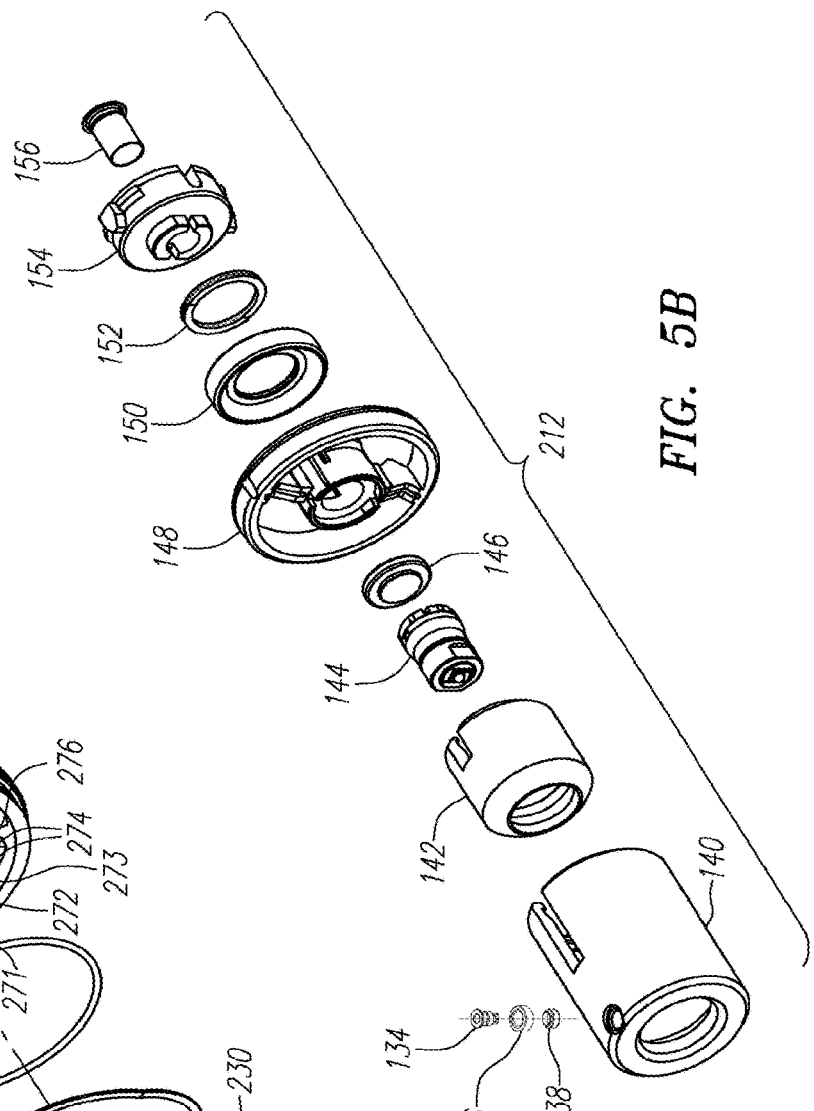
FIG. 5A
FIG. 5B

PORTABLE LIGHTING DEVICES

CROSS REFERENCE TO RELATED APPLICATION

This application is a continuation of U.S. patent application Ser. No. 15/710,273, filed Sep. 20, 2017, which itself is a continuation of U.S. patent application Ser. No. 15/370,794, filed Dec. 6, 2016, issued Oct. 24, 2017 as U.S. Pat. No. 9,801,256, which itself is a continuation of U.S. patent application Ser. No. 15/238,629, filed Aug. 16, 2016, issued Dec. 8, 2016 as U.S. Pat. No. 9,549,454, which itself is a continuation of U.S. patent application Ser. No. 14/642,607, filed Mar. 9, 2015, issued Sep. 20, 2016 as U.S. Pat. No. 9,447,951, which itself is a continuation of U.S. patent application Ser. No. 13/398,611, filed 02-1612, issued Mar. 10, 2015 ad U.S. Pat. No. 8,975,822, which itself is a continuation of U.S. patent application Ser. No. 12/188,233, filed Aug. 8, 2008, issued Mar. 13, 2012 as U.S. Pat. No. 8,134,300, the disclosures of all of which are incorporated herein by reference in their entireties as if fully set forth herein.

FIELD OF THE INVENTION

The present invention relates to portable lighting devices, including, for example, flashlights and headlamps, and their circuitry.

BACKGROUND

Various handheld or portable lighting devices, including flashlights, are known in the art. Flashlights typically include one or more dry cell batteries having positive and negative electrodes. In certain flashlights, the batteries are arranged in series in a battery compartment of a barrel or housing that can be used to hold the flashlights. An electrical circuit is frequently established from a battery electrode through conductive means which are electrically coupled with an electrode of a light source, such as a lamp bulb or a light emitting diode ("LED"). After passing through the light source, the electric circuit continues through a second electrode of the light source in electrical contact with conductive means, which in turn are in electrical contact with the other electrode of a battery. Typically, the circuit includes a switch to open or close the circuit. Actuation of the switch to close the electrical circuit enables current to pass through the lamp bulb, LED, or other light source—and through the filament, in the case of an incandescent lamp bulb—thereby generating light.

Conventional flashlights also frequently include a head assembly, which typically includes a head, a lens, a face cap, and a reflector. The face cap in such flashlights is typically attached to the head to hold the lens and reflector relative to the head. Head assemblies of this type are often threadably mounted to the forward end of the body or barrel of the flashlight via the head. Such head assemblies are not conducive, however, to accessing a light source alignment device, such as the light source alignment devices included in the flashlights described in U.S. Pat. No. 7,264,372 B2 ("the '372 patent") or U.S. Patent Publication 2007/0064354 A1 ("the '354 publication"), both of which are assigned to MAG Instrument, Inc.

The '372 patent teaches a head assembly including a face cap, lens, a sleeve or skirt, and a sealing O-ring that are configured and arranged so that the face cap and sleeve define a clearance envelope surrounding the flange of a reflector module to solve this problem. As a result, the head assembly may be rotated about the axis of the flashlight relative to reflector module so as to cause the light source to translate along the axis of the reflector and vary the dispersion of light produced by the flashlight. Further, the user may disengage the sleeve or skirt from the face cap and then slide it rearward to gain access to the light source alignment device and thereby move the light source in one or more directions lateral to the axis of the reflector to align the substantial point source of light with the axis of the reflector. The disadvantage of this construction is that when the sleeve or skirt is disengaged from the face cap, the face cap, and hence the lens, are no longer connected to the reflector module or any other portion of the flashlight, and hence they are liable to be dropped and/or damaged.

The flashlight described in the '354 publication solves this problem through the use of a support structure to which the face cap and skirt (which is referred to as the head in the '354 publication) are separately attached. The face cap is threadably attached to the support structure of the flashlight and retains the lens and reflector relative to the support structure. Thus, when the skirt is detached from the support structure to gain access to the light source alignment device included in the flashlight of the '354 publication, the face cap and associated optics remain attached to the flashlight, thereby minimizing the potential for damage to the same. However, the skirt of the '354 patent publication is attached to the support structure via a compressible retaining ring. More particularly, the internal surface of the skirt is configured to mate with the outer surface of the support structure of the flashlight at select locations to properly position the skirt relative to the face cap and the support structure. The compressible retaining ring is then provided in a channel extending around the outer surface of the support structure to create an interference fit with a feature provided on the internal surface of the skirt. Because the skirt must be removable in order for the user to access the light source alignment device included in the flashlight described in the '354 publication, however, the compressible retaining ring may not provide a permanent type interference fit. Indeed, to permit the average user to remove the skirt without undue effort, the interference fit must be relatively weak. As a result, the skirt of this flashlight is subject to being unintentionally disconnected from the support structure if the flashlight is dropped on its tail or otherwise receives a jolt to the tail of the flashlight. The unintentional detachment of the skirt from the support structure in this manner is undesirable.

Although the '372 patent and '354 publication indicate that the light source employed in the flashlights described in each of the patent documents may be an LED, these patent documents do not teach a configuration that suitably addresses the thermal management issues created by high power, high brightness LEDs.

Some advanced portable lighting devices provide multiple functions for different needs. For example, a power saving mode and/or an SOS mode may be implemented in a flashlight or other portable lighting devices in addition to the normal "full power" mode. In such portable lighting devices, the user typically elects the desired mode of operation by manipulation of the main power switch. For example, when the flashlight is in the normal mode or the power save mode of operation, the flashlight may be transitioned to another mode of operation, such as an SOS mode by manipulating the main power switch to momentarily turn off and then turn back on the flashlight.

Typically the functionality of multi-mode portable lighting devices of this sort is provided by a microcontroller, which remains powered by the batteries at all times. As a result, the volatile memory of the microcontroller may be used to remember the current mode of the flashlight, and thus determine which mode to transition into in the event that a user enters the proper command signal. However, if the portable lighting device—particularly in the case of larger flashlights—is accidentally hit against or dropped on a hard surface, the inertia of the battery or batteries may cause the battery or batteries to disconnect from one of the battery contacts for a short period of time. This disconnection will also cause a power loss to the microcontroller, thereby causing the microcontroller to lose track of the mode the flashlight or other lighting device was in prior to the power loss. As a result, the microcontroller will reset the flashlight or other lighting device to its default mode, which is typically off, rather than automatically returning to the prior mode of operation. Resetting under such circumstances is undesirable and potentially hazardous.

Portable lighting devices that include advanced functionality typically include a printed circuit board with a microcontroller or microprocessor to provide the desired functionality. A need exists, however, for a push button switch assembly that includes an integral circuit board that may be readily employed in a variety of portable lighting devices to provide multiple levels of functionality to the same.

In view of the foregoing, a need exists for an improved technique of attaching a flashlight skirt to the flashlight while also providing a user friendly operation when detaching the skirt. A separate need also exists for an improved portable lighting device that addresses or at least ameliorates one or more of the problems discussed above.

SUMMARY

The present invention is generally directed to a method for increasing battery life in a lighting device powered by a battery source in which an electronic circuit is caused to provide a declining power supply to a light emitting diode ("LED") as a power profile of the battery source declines.

Further aspects, objects, and desirable features, and advantages of the invention will be better understood from the following description considered in connection with the accompanying drawings in which various embodiments of the disclosed invention are illustrated by way of example. It is to be expressly understood, however, that the drawings are for the purpose of illustration only and are not intended as a definition of the limits of the invention.

BRIEF DESCRIPTION OF THE DRAWINGS

FIG. 5A is an enlarged exploded perspective view of a portion of the head assembly of the flashlight of FIG. 1. FIG. 5B is an enlarged exploded perspective view of the adjustable ball assembly portion of the flashlight of FIG. 1.

DETAILED DESCRIPTION

Figure 1:
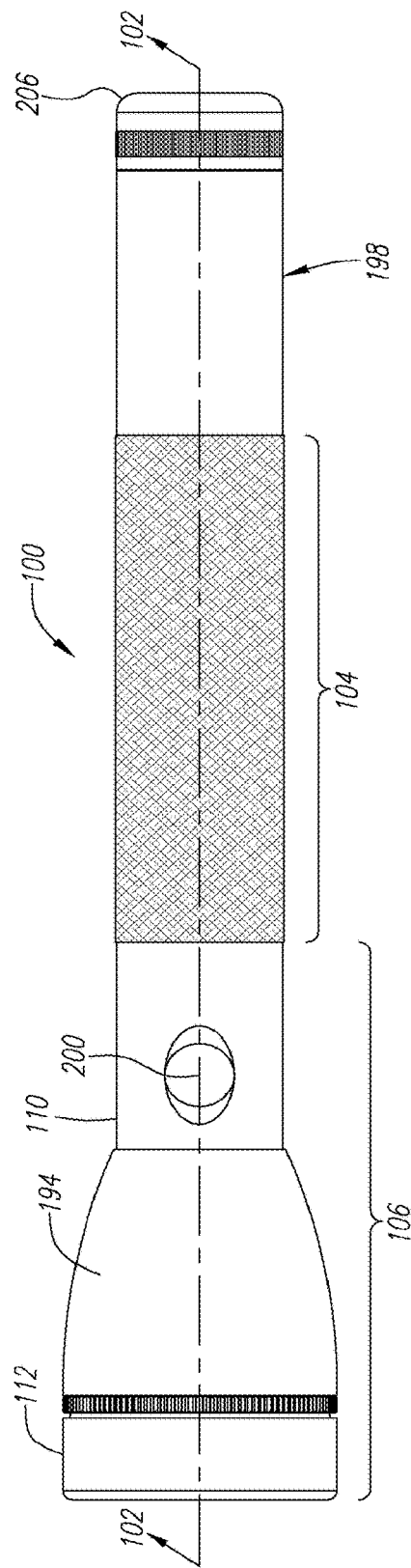
FIG. 1 is a top view of a flashlight according to one embodiment of the present invention.

Embodiments of the invention will now be described with reference to the drawings. To facilitate the description, any reference numeral representing an element in one figure will represent the same element in any other figure. Further, in the description that is to follow, upper, front, forward or forward facing side of a component shall generally mean the orientation or the side of the component facing the direction toward the front end of the portable lighting device or flashlight. Similarly, lower, aft, back, rearward or rearward facing side of a component shall generally mean the orientation or the side of the component facing the direction toward the rear of the portable lighting device, (e.g. where the tail cap is located in the case of a flashlight).

Flashlights 100, 300 according to different embodiments of the present invention are described in connection with FIGS. 1-11C below. Each of the flashlights 100, 300 incorporate a number of distinct aspects of the present invention. While these distinct aspects have all been incorporated into the flashlight 100, 300 in various combinations, it is to be expressly understood that the present invention is not restricted to flashlights 100, 300 described herein. Rather, the present invention is directed to each of the inventive features of the flashlights 100, 300 described below individually as well as collectively. Further, as will become apparent to those skilled in the art after reviewing the present disclosure, one or more aspects of the present invention may also be incorporated into other portable lighting devices, including, for example, headlamps.

Figure 2:
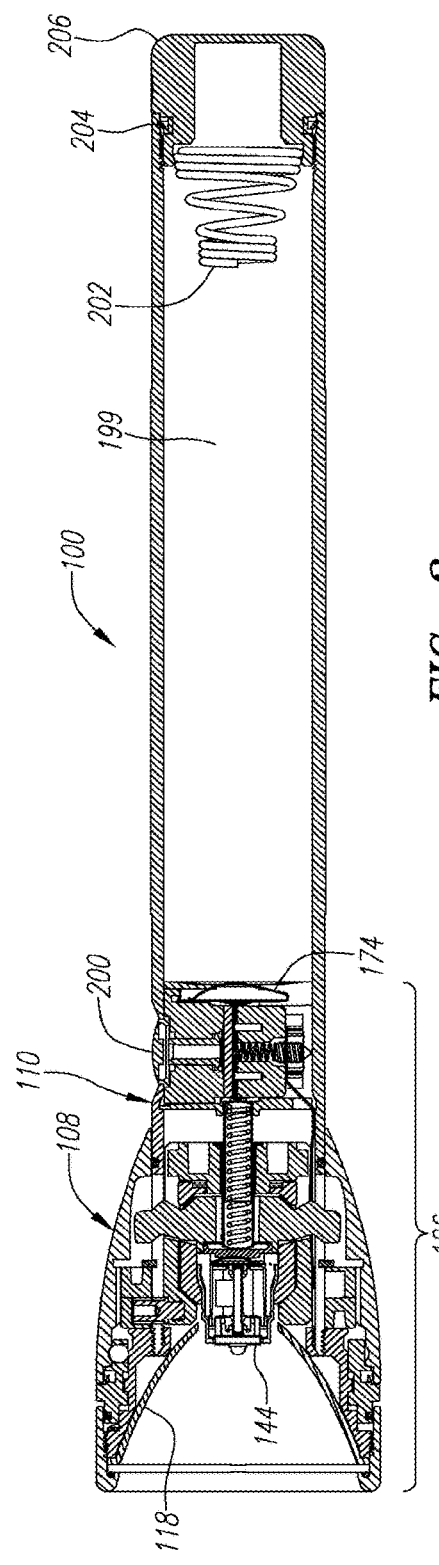
FIG. 2 is a cross-sectional view of the flashlight of FIG. 1, taken along the plane indicated by 102-102.

Referring to FIGS. 1-2, flashlight 100 includes a barrel 198 enclosed at a rearward end by a tail cap 206 and at a forward end by a head assembly 210.

Barrel 198 is preferably made out of aluminum. As is known in the art, barrel 198 may be provided with a textured surface 104 along its axial extent, preferably in the form of machined knurling. A portion of forward end 110 of barrel 198 extends beneath head skirt 194. A compartment 199 is formed in barrel 198 to hold a portable power source, such as one or more batteries in series, or a battery pack with cells arranged in series or parallel. Further, the employed batteries or battery pack may be rechargeable.

Tail cap 206 is also preferably made out of aluminum and is configured to engage mating threads provided on the interior of barrel 198 as is conventional in the art. However, other suitable means may also be employed for attaching tail cap 206 to barrel 198. A one-way valve 204, such as a lip seal, may be provided at the interface between tail cap 206 and barrel 198 to provide a watertight seal while simultaneously allowing overpressure within the flashlight to expel or vent to atmosphere. However, as those skilled in the art will appreciate, other forms of sealing elements, such as an O-ring, may be used instead of one-way valve 204 to form a watertight seal. The design and use of one-way valves in flashlights is more fully described in U.S. Pat. No. 5,113,326 to Anthony Maglica, which is hereby incorporated by reference.

If made out of aluminum, the surfaces of barrel 198 and tail cap 206 are preferably anodized with the exception of those surfaces used to make electrical contact with another metal surface for purposes of forming the electrical circuit of the flashlight. In the present embodiment, an electrical path is formed between barrel 198 and the case electrode of the batteries or battery pack installed in the compartment 199 by spring 202 and tail cap 206. In addition to forming part of the electrical path between the barrel and case electrode, spring 202 also urges batteries or battery pack installed in the compartment 199 forward so that the center electrode of the front-most battery or battery pack is urged into one end of spring contact 174.

Referring to FIGS. 1-4, the present embodiment includes a head 120 to which a number of other components may be mounted, including, for example, skirt lock ring 126, wave spring 122, head skirt 194, face cap 112, lens 116, and reflector 118 to form a head assembly 210. Head 120, skirt lock ring 126, head skirt 194 and face cap 112 are preferably made from anodized aluminum. On the other hand, reflector 118 is preferably made out of injection molded plastic. The interior surface of reflector 118 is preferably metallized to enhance its reflectivity to a suitable level.

In the present embodiment, head 120 is a hollow support structure comprising a front section 216, a midsection 218 and an aft section 230. Head 120 is internally disposed in the present embodiment in that head 120 is covered by face cap 112, skirt lock ring 126, and head skirt 194 when the flashlight 100 is fully assembled. In other words, in the present embodiment, head 120 does not comprise an external portion of the flashlight 100. The front section 216 comprises a generally cup-shaped receiving area 232 for receiving reflector 118. The midsection 218, which extends rearward from the front section 216, includes a generally cylindrical inner surface 234. And, the aft section 230, which extends rearward from the midsection 218, includes internal threads 236 which are configured to mate with external threads 197 on the forward end of barrel 198. The head 120 is locked to the barrel 198 with retainer 132. Retainer 132 is externally threaded with threads 240 on its aft end and is outwardly tapered on its forward end. Retainer 132 is configured so that external threads 240 mate with internal threads 195 provided on the forward end of barrel 198. Because the forward end 110 of barrel 198 includes opposing slots 111, when retainer 132 is threaded into threads 125 of barrel 198, barrel 198 is expanded as the tapered portion of retainer 132 contacts barrel 198 and is then screwed further into the barrel 198. When retainer 132 is fully seated in barrel 198, head 120 is locked to the barrel 198.

Figure 3:
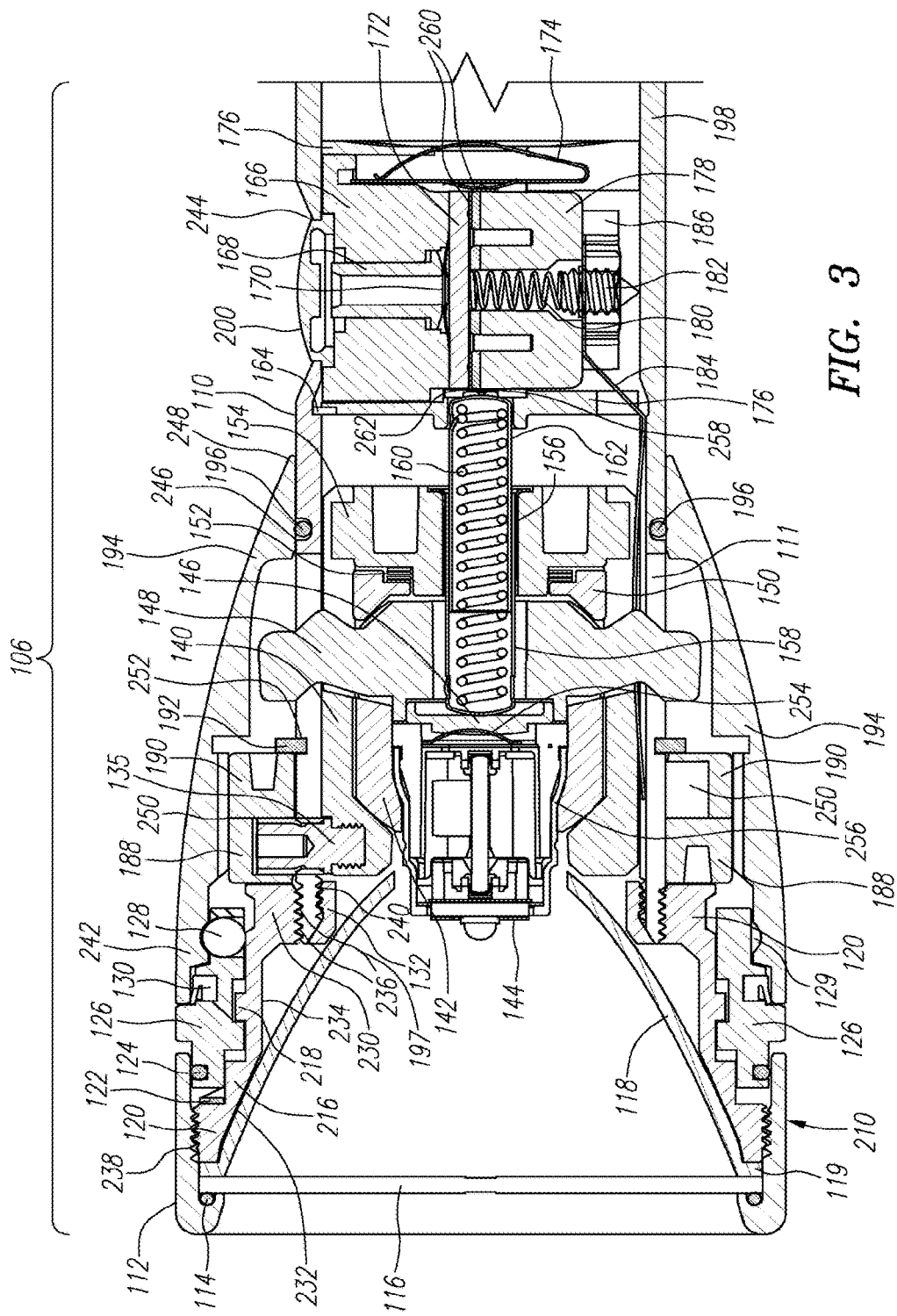
FIG. 3 is an enlarged cross-sectional view of the forward section of the flashlight of FIG. 1 taken through the plane indicated by 102-102.

The face cap 112 retains lens 116 and reflector 118 relative to the head 120 and reflector 118. In the present embodiment, face cap 112 is configured to thread onto external threads 238 provided on the front section 216 of the head 120. In other implementations, however, other forms of attachment may be adopted. An O-ring 114 is provided at the interface between face cap 112 and lens 116 to provide a watertight seal. As best seen in FIG. 3, reflector 118 is positioned within the cup-shaped receiving area 232 of head 120 so that it is disposed forward of the head 120 and retainer 132. The internal surface of the cup-shaped receiving area 232 together with the outer surface of reflector 118 and reflector flange 119 ensure the proper alignment of the principal axis of reflector 118 with the central axis of the barrel 198. The face cap 112 in turn clamps O-ring 114, lens 116, and reflector 118 via reflector flange 119 to head 120.

Head skirt 194 has a diameter greater than that of the barrel 198. Head skirt 194 is also adapted to pass externally over the exterior of the barrel 198. The forward end 242 of head skirt 194 is configured to mate with the outer surface of a skirt lock ring 126 at select locations to properly position head skirt 194 relative to face cap 112 and head 120.

The locking mechanism of the head skirt 194 will now be described. FIG. 5A shows an exploded view of a portion of head assembly 210. The outer surface of head 120 has a normally smooth surface 266 with an annular groove 267 on the outer surface of aft section 230 and a plurality of protuberances 268 equally spaced from each other around the outer circumference of the midsection 218 of head 120. As best seen in FIGS. 6C, 6F, and 6I, a gap 231 is formed between each protuberance 268 and the front section 216 of head 120. In the present embodiment, six protuberances 268 are used. Each of the protuberances 268 has a cut 269 on the front end such that each of the protuberances 268 have a reversed L-shaped cross-section in the longitudinal direction of flashlight 100 as seen in FIG. 6C, for example. At the toe of the reversed L-shaped protuberances 268 is a lock member 270. In the present embodiment, the number of protuberances 268 is six. In other embodiments, the number of protuberances 268 may be different. However, the number of protuberances 268 should be an integer number greater than or equal to three.

The inner surface of skirt lock ring 126 has a front end 281, an aft end 282 and a middle portion 283 in between. The inner surface of skirt lock ring 126 comprises a plurality of longitudinal channels 271 formed by a plurality of first indexing bumps 272 and second indexing bumps 275. In the present embodiment, six first indexing bumps 272 are formed near the middle portion 283 of the inner surface of the skirt lock ring 126 and six second indexing bumps 275 are formed near the aft end 282 of the inner surface of the skirt lock ring 126. Each of the first indexing bumps 272 comprises two high plateau regions 274 separated by a low plateau region 273. Similarly, each of the second indexing bumps 275 comprises two high plateau regions 277 separated by a low plateau region 276. In the present embodiment, some of the high plateau regions 277 of the second indexing bumps 275 have a hole 278 sized to receive a ball 128. In the present embodiment, three holes 278 are equally spaced from each other around the inner circumference of skirt lock ring 126. In the present embodiment, the number of first indexing bumps 272 is the same as the number of second indexing bumps 275. In an alternate embodiment, the number of first indexing bumps 272 may be an integer multiple of the number of second indexing bumps 275. In another embodiment, the number of first indexing bumps 272 is an integer factor of the number of second indexing bumps 275. In the present embodiment, the number of second indexing bumps 275 is the same as the number of protuberances 268. In other embodiments, the number of second indexing bumps 275 may be an integer multiple of the number of protuberances 268.

Figure 6A:
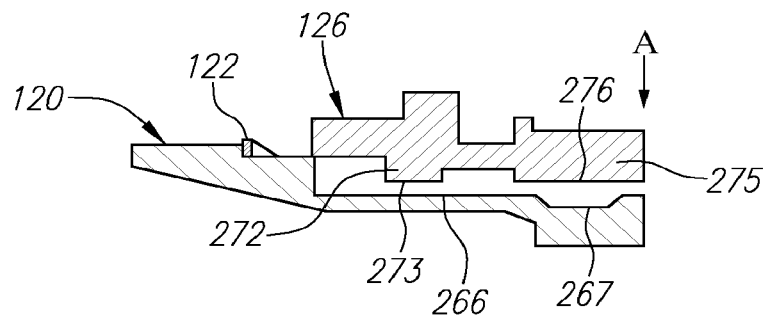
FIGS. 6A through 6C are different cross-sectional views illustrating one relative position between the skirt lock ring and head.
Figure 6B:
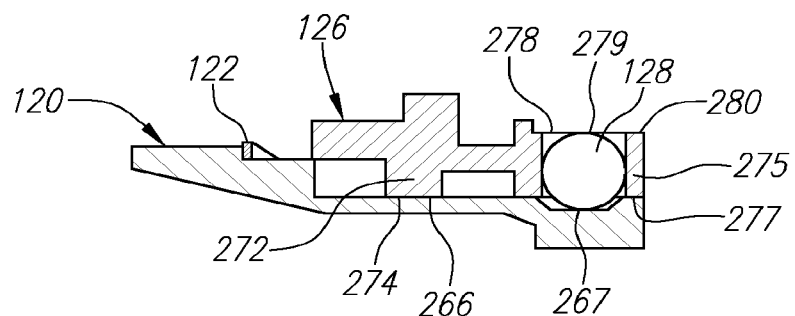

FIGS. 6A-C show different cross-sectional views through the head 120 and skirt lock ring 126 when the skirt lock ring 126 has been rotated to a position which unlocks the head skirt 126 axially from the head 120. FIGS. 6A-6C also show skirt lock ring 126 in a position (position A) relative to head 120 where their aft ends are aligned. Balls 128 now sits in trench 267 and the top end 279 of ball 128 is lower than the top surface 280 near the aft end of skirt lock ring 126. Accordingly, head skirt 194 can be freely mounted to or dismounted from skirt lock ring 126 at this position. When every protuberance 268 of head 120 is aligned with a channel 271 of skirt lock ring 126 (as shown in FIG. 6C) by rotating skirt lock ring 126 to a suitable position, then the first indexing bumps 272 and the second indexing bumps 275 are aligned with the smooth surface 266 of skirt lock ring 126 (as shown in FIGS. 6A-6B). In this position, skirt lock ring 126 may be freely moved axially forward or rearward over head 120. FIG. 6A more particularly shows where low plateau regions 273, 276 of skirt lock ring 126 are aligned with the smooth surface 266 of head 120, and FIG. 6B more particularly shows where high plateau regions 274, 277 of skirt lock ring 126 are aligned with the smooth surface 266 of head 120. When the skirt lock ring 126 is indexed to this position, it is in a position in which it may be moved forward or rearward relative to head 120 by an operative amount. However, skirt lock ring 126 can not be rotated relatively to head 120 because protuberances 268 and high plateau regions 274 are next to each other so that high plateau regions 274 extend too far out from skirt locking ring 126 to pass over protuberances 268.

Figure 6C:
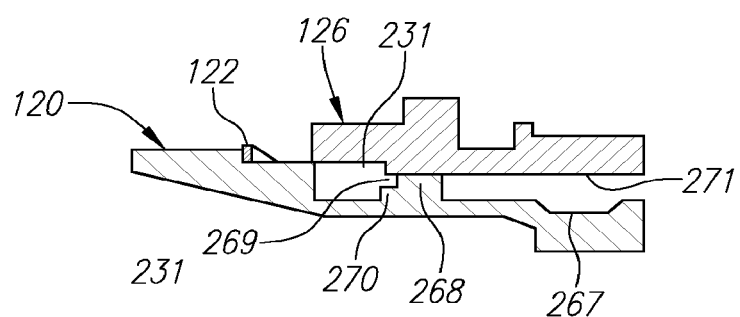
Figure 6D:
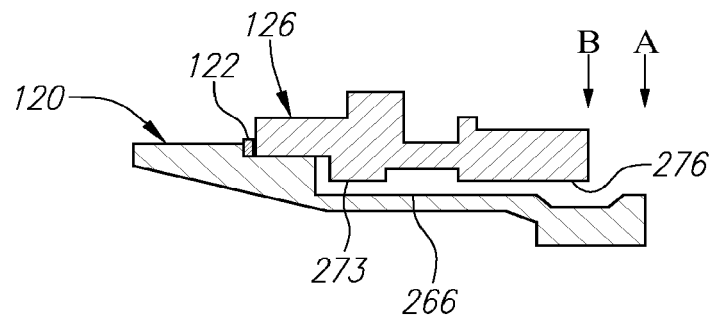
FIGS. 6D through 6F are different cross-sectional views illustrating a second relative position between the skirt lock ring and head.
Figure 6E:
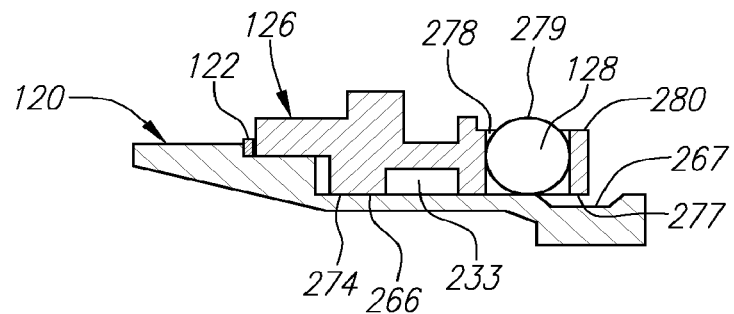

When skirt lock ring 126 and head 120 are aligned as illustrated in FIGS. 6A-6C, skirt lock ring 126 may be pushed forward to position B against the spring force of wave spring 122, as shown in FIGS. 6D-6F. When skirt lock ring 126 is pushed forward in this manner protuberances 268 and high plateau regions 274 are no longer next to each other. As a result, skirt lock ring 126 can now be rotated relative to head 120 because high plateau regions will now pass through gap 231 between protuberance 268 and the front section 216 of head 120 as skirt lock ring 126 is rotated. Balls 128, however, no longer sit in trench 267, but instead are disposed on the smooth surface 266. As a result, the top end 279 of ball 128 is now higher than the top surface 280 near the aft end of skirt lock ring 126. If the head skirt 194 is mounted to the skirt lock ring 126, the ball 128 will extend into annular groove 129 formed in the interior surface of head skirt 194. However, because protuberances 268 remain aligned with channels 271, the skirt lock ring 126 remains subject to being moved rearward to position A shown in FIGS. 6A-6C and thus the head skirt 194 is not axially locked to the head 120 at this point.

Figure 6F:
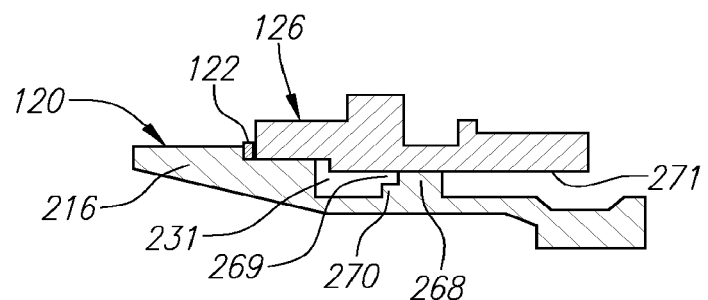
Figure 6G:
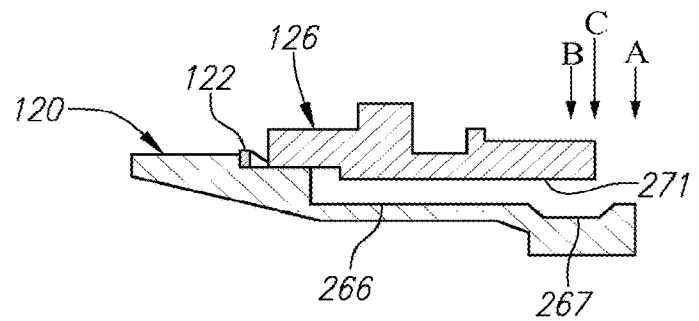
FIGS. 6G through 6I are different cross-sectional views illustrating a third relative position between the skirt lock ring and head.
Figure 6H:
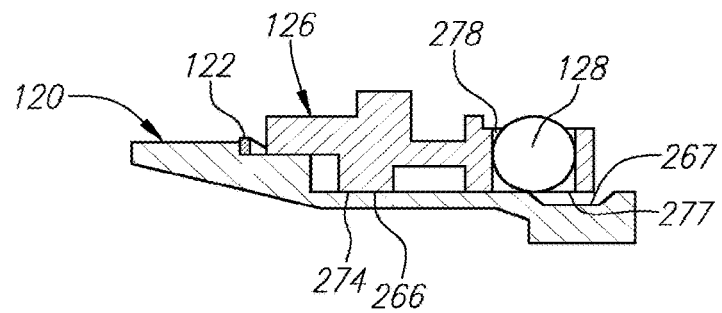

When skirt lock ring 126 and head 120 are aligned as described in FIGS. 6D-6F, skirt lock ring 126 can be rotated relatively to head 120. If a user rotates skirt lock ring 126 30° in either direction and then releases the skirt lock ring 126 wave spring 122 will bias the skirt lock ring 126 rearward, and the relationship between skirt lock ring 126 and head 120 will be the position (position C) as shown in FIGS. 6G-6I. Now, protuberances 268 are aligned with low plateau regions 273 (as shown in FIG. 6I). Further, the spring force of wave spring 122 pushes skirt lock ring 126 rearward until a corner of each low plateau region 273 fits into a cut 269 of an opposing protuberance 268 and lock members 270 are positioned under the low plateau regions 273. In this manner, skirt lock ring 126 can not be rotated relatively to head 120 because each side of lock member 270 of protuberances 268 is now next to a high plateau region 274. In addition, balls 128 are still disposed on the smooth surface 266, and, as a result, the top end 279 of ball 128 is still higher than the top surface 280 near the aft end of skirt lock ring 126. Thus, if head skirt 194 is mounted, it will be axially locked by ball 128 to head 120 and can not be dismounted (as shown in FIGS. 2-3).

When head skirt 194 is locked (as shown in FIGS. 2-3), the skirt lock ring 126 and head 120 are aligned as illustrated in FIGS. 6G-6I. To access adjusting ring 148 to adjust the alignment of the beam direction of the substantial point source of light, namely LED 145 of LED module 144 in the present embodiment, with the principal axis of the reflector, head skirt 194 must be unlocked and slid rearward over barrel 198 at least far enough for the user to gain access to adjustment ring 148. The procedure for accomplishing this is described below.

First, when head skirt 194 is axially locked to the head 120 by the skirt locking ring 126, the skirt lock ring 126 and head 120 are aligned as illustrated in FIGS. 6G-6I. Further, skirt lock ring 126 can not be rotated relative to head 120. However, the head skirt 194 is free to rotate about the skirt locking ring 126 and barrel 198 to axially translate the light source along the axis of the reflector as discussed more fully below. Further, the skirt lock ring 126 together with the head skirt 194 may be pushed forward against wave spring 122 to unlock skirt lock ring 126 from head 120. By rotating the skirt lock ring 126 30° in either direction, the skirt lock ring 126 and head 120 are aligned as illustrated in FIGS. 6D-6F, and, as a result, the head skirt 194 is axially unlocked from the head member 194 and thus may be removed from the flashlight 100. This is because skirt lock ring 126 is now free to move from position B to position A, and once skirt lock ring 126 and head 120 are aligned in position A, as shown in FIGS. 6A-6C, balls 128 will fall into trench 267 and the top end 279 of balls 128 will no longer be higher than the top surface 280 near the aft end of skirt lock ring 126. Accordingly, head skirt 194 may continue to be moved rearward and dismounted. It is no longer locked by ball 128 and head skirt 194 can now be dismounted. However, cam 188 will block skirt lock ring 126 from moving rearward beyond its position in position A.

If it is desired to mount head skirt 194 back to have a complete flashlight assembly, the following procedure can be used. First, head skirt 194 is slid forward over the flashlight barrel 198 until it abuts skirt lock ring 126. Once head skirt 194 abuts skirt lock ring 126, head skirt 194 together with skirt lock ring 126 may be pushed forward to position B against the spring force of wave spring 122, as shown in FIGS. 6D-6F. Balls 128 are now disposed on the smooth surface 266 and the top end 279 of ball 128 is higher than the top surface 280 near the aft end of skirt lock ring 126 so as to extend into annular groove 129 in head skirt 194.

Once in position B, skirt lock ring 126 may be rotated 30° in either direction and then released. Wave spring 122 will bias the skirt lock ring 126 rearward so that the skirt lock ring 126 and head 120 are placed in position C as shown in FIGS. 6G-6I. At this point, skirt lock ring 126 can no longer be rotated because lock members 270 of protuberances 268 are now locked by high plateau regions 274. Because balls 128 are now disposed on the smooth surface 266, as shown in FIG. 6H and skirt lock ring 126 can not be rotated, head skirt 194 is axially locked to the head 120 and can not be dismounted (as shown in FIGS. 2-3).

Referring back to FIGS. 1-4, an O-ring 124 is provided at the interface between face cap 112 and skirt lock ring 126 to provide a watertight seal.

A one-way valve 130, such as a lip seal, may be provided at the interface between the head skirt 194 and skirt lock ring 126 to provide a watertight seal and to prevent moisture and dirt from entering head and switch assembly 106 between skirt lock ring 126 and the forward end 242 of head skirt 194.

As noted above, a portion of the forward end 110 of barrel 198 is disposed under head skirt 194 when it is mounted to the flashlight 100. The forward most portion of the forward end 110 is interposed between, and threadably attached to, the aft section 230 of the head 120 and retainer 132 as explained above. As a result of the foregoing construction, with the exception of the external surface formed by switch cover 200, all of the external surfaces of the flashlight 100 according to the present embodiment may be made out of metal, and more preferably aluminum.

The forward end 110 of barrel 198 is provided with a hole 244 through which a seal or switch cover 200 extends. The outer surface of forward end 110 of barrel 198 surrounding switch cover 200 may be beveled to facilitate tactile operation of flashlight 100. Forward end 110 of barrel 198 may also be provided with a groove 246 about its circumference at a location forward of the trailing edge 248 of head skirt 194 for positioning a sealing element 196, such as an O-ring, to form a watertight seal between the head skirt 194 and barrel 198. Similarly, switch cover 200 is preferably made from molded rubber. As best illustrated in FIG. 3, switch cover 200 is preferably configured to prevent moisture and dirt from entering the head and switch assembly 106 through hole 244.

Referring to FIG. 5B, the components of an adjustable ball assembly 212 according to the present embodiment are illustrated. In the present embodiment, a lamp or other light source, such as LED 145 of LED module 144, is mounted within head and switch assembly 106 so as to extend into reflector 118 through a central hole provided therein. In particular, LED module 144 is mounted on adjustable ball assembly 212, which in turn is slideably mounted within the forward end 110 of barrel 198. The adjustable ball assembly 212 is prevented from sliding out of the forward end 110 of barrel 198 by retainer 132, head 120, and cam assembly 188, 190 and cam follower assembly 135. In the present embodiment, cam follower assembly 135 includes a cam follower screw 134, a cam follower roller 136, and a cam follower bushing 138.

An LED module that may be used for LED module 144 is described in co-pending U.S. patent application Ser. No. 12/188,201, filed Aug. 7, 2008, by Anthony Maglica et al., the contents of which is hereby incorporated by reference.

Figure 4:
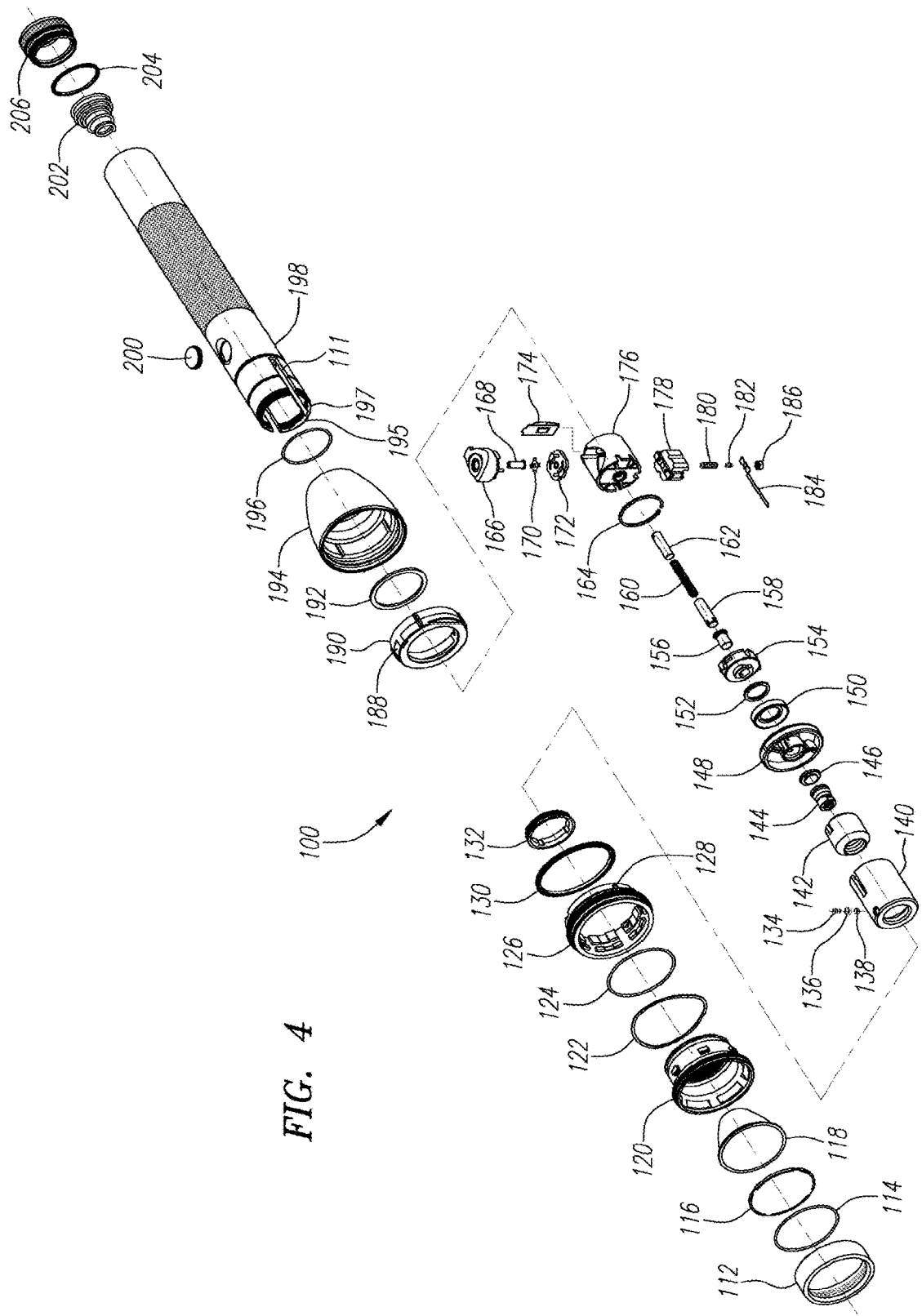
FIG. 4 is an exploded perspective view of the flashlight of FIG. 1.

Referring to FIGS. 3 and 4, when adjustable ball assembly is positioned inside the front end 110 of barrel 198 and the cam follower assembly 135 is positioned in one of the axial slots 111 the radial arms of adjusting ring 148 will extend through the opposing slots 110 on the front end 110 of barrel 198. Further, the reflector 118 is sized so that the LED module 144 held by the adjustable ball assembly 212 is positioned adjacent the central opening in the aft end of reflector 118.

Still referring to FIG. 3, the moveable cam assembly 188, 190 is sized to fit around the outer diameter of the barrel 198. Front cam half 188 and rear cam half 190 form the cam assembly 188, 190 which is generally a barrel cam with a curved cam channel 250 that extends around the inner circumference of the cam assembly 188, 190. The cam assembly 188, 190 is also sized such that when installed, the cam follower roller 136 of the cam follower assembly 135 engages with cam channel 250. Accordingly, the cam channel 250 is able to define the axial rise, fall, and dwell of the adjustable ball assembly 212. This is because the cam follower assembly 135 is able to slide in the curved cam channel 250 of the cam assembly 188, 190 when cam assembly 188, 190 is rotated.

The cam assembly is held longitudinally in place between the aft end of head 120 and snap ring 192. Because the curved cam channel 250 is disposed transverse to the axis of the flashlight 100, when cam assembly 188, 190 is rotated, ball housing 140 (along with LED module 144) will move forwards and backwards along the longitudinal direction of flashlight 100, changing the dispersion of light created by the flashlight from spot to flood and then from flood to spot.

In the present embodiment, forward end 110 of barrel 198 preferably includes a groove 252 about its circumference for positioning external snap ring 192 to keep the cam assembly 188, 190 from moving toward the rear direction of the flashlight 100.

Cam assembly 188, 190 is preferably a two piece construction so that the separate halves may be fitted over the outer diameter of the flashlight barrel 198 and the cam follower assembly 135. The tow pieces of the moveable cam assembly 188, 190 may be secured together by any suitable method. Preferably, the respective cam halves are formed to snap together.

Referring to FIG. 4, longitudinal locking ribs are provided on the outer diameter of the cam assembly 188, 190. Preferably the locking ribs are equally spaced around the outer circumference of the cam assembly. Corresponding longitudinal locking slots are provided on the interior surface of the head skirt 194. As a result, when head skirt 194 is mounted on the flashlight 100 and it is rotated about the axis of the barrel 198, cam assembly 188, 190 will also be caused to rotate about the barrel 198. Rotation of the cam assembly 188, 190 in turn will cause the adjustable ball assembly 212 to axially displace along the inside of reflector 118. In this way, the LED module 144 or other light source may be caused to translate along the reflector axis.

One of the electrode contacts, the positive electrode 254 in the present embodiment, of LED module 144 extends into a contact disc 146 where they are preferably frictionally engaged. Another electrode contact, the negative electrode 256 in the present embodiment, is configured to make electrical connection with the inner surface of ball 142, which is preferably made out of metal. As previously described, the ball 142 is slideably mounted via ball housing 140, which is also preferably made out of metal, within the front end 110 of barrel 198.

Contact disc 146 is in electrical communication with an outer contact sleeve 158. Outer contact sleeve 158 is slideably engaged with an inner contact sleeve 162. A spring 160 is installed within the outer contact sleeve 158 and the inner contact sleeve 162 to allow relative movement between the outer contact sleeve 158 and the inner contact sleeve 162 while maintaining electrical communication between contact disc 146 and the aft end of inner contact sleeve 162. In the present embodiment, the outer contact sleeve 158, inner contact sleeve 162, and spring 160 are preferably made out of metal.

Outer contact sleeve 158 is further slideably held by a non crush sleeve 156, which in turn is held within a retainer 154. Retainer 154 is in turn held by ball housing 140. In the present embodiment, non crush sleeve 156 is preferably made out of metal while retainer 154 is preferably made out of non-conductive material, such as plastic.

An adjusting ring 148 is located between retainer 154 and contact disk 146 to slightly adjust the axial direction of LED module 144, and hence LED 145. Adjusting ring 148 is supported by a push cup 150. Push cup 150 is located between the adjusting ring 148 and retainer 154. In the present embodiment, a wave spring 152 is further inserted between the push cup 150 and retainer 154 to provide cushion.

Inner contact sleeve 162 is frictionally held by main switch housing 176 so that the aft end of inner contact sleeve 162 is in electrical communication with an assembled circuit board 172 at via 258.

Figure 5C:
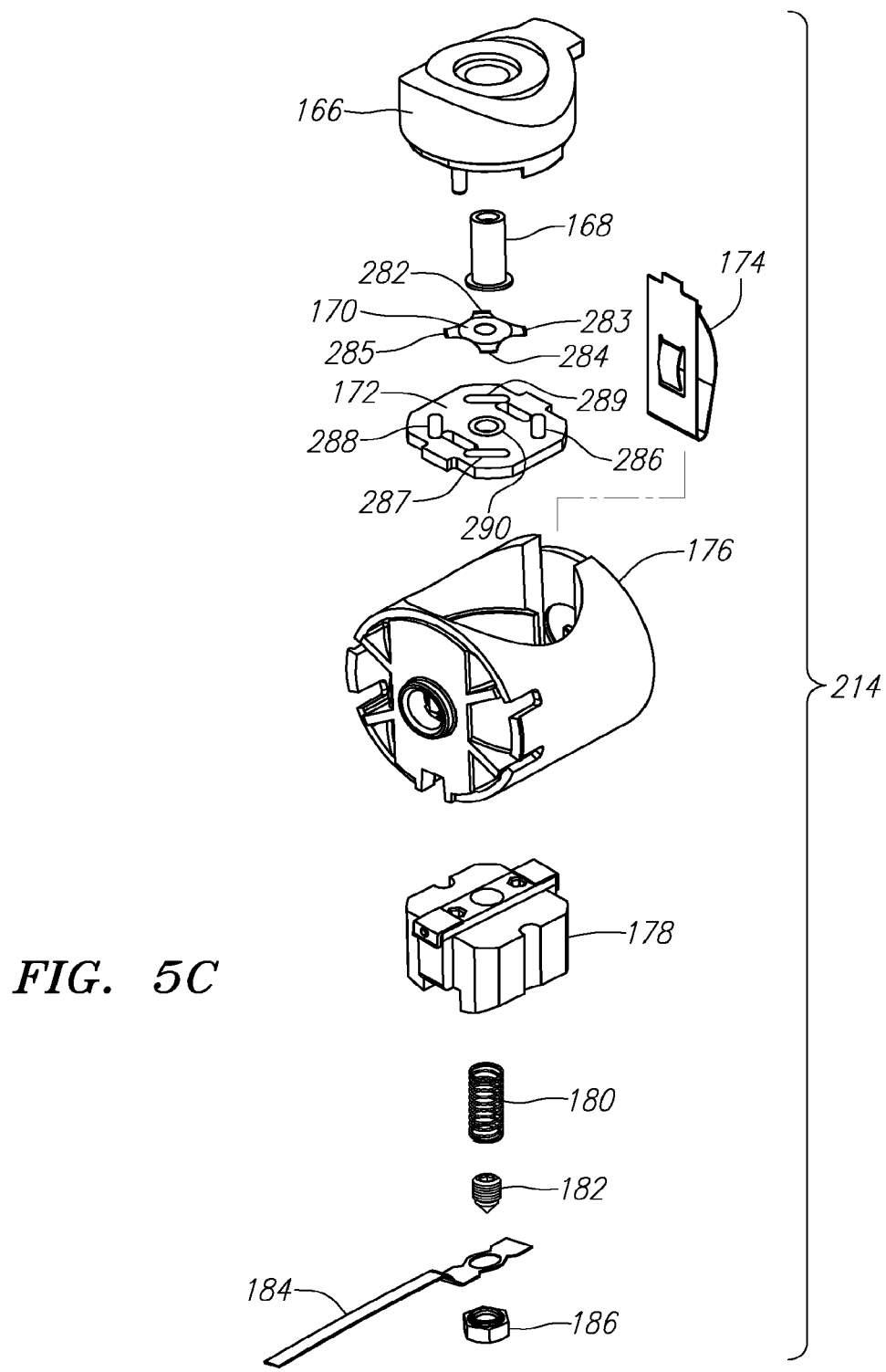
FIG. 5C is an enlarged exploded perspective view of the switch assembly portion of the flashlight of FIG. 1.
Figure 6I:
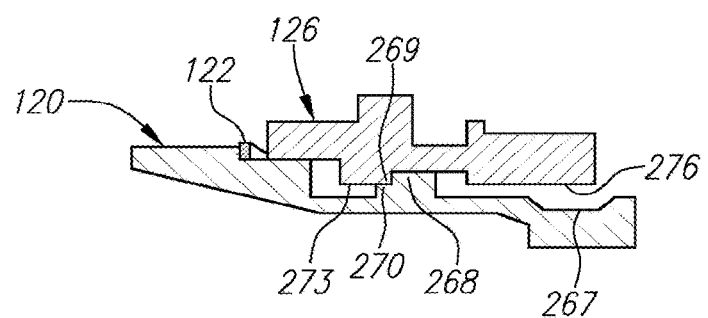

Referring to FIGS. 3, 4 and 5C which shows components of a switch assembly 214, switch assembly 214 preferably includes a main switch housing 176 and a user interface, which is a switch cover 200 in the present embodiment. Main switch housing 176 encloses an upper switch housing 166, an actuator 168, a snap dome 170, an assembled circuit board 172, a snap in contact 174, a lower switch housing 178, a switch spring 180, a set screw 182, a ground contact 184, and a hex nut 186. In the present embodiment, snap in contact 174, switch spring 180, set screw 182, ground contact 184, and hex nut 186 are preferably made out of metal while main switch housing 176, upper switch housing 166, actuator 168, and lower switch housing 178 are preferably made out of non-conductive material, such as plastic.

Referring to FIG. 5C, in the present embodiment, the snap dome 170 has four legs with one leg 282 shorter than other three legs 283, 284, 285. The legs 283, 284, 285 are used to contact to ground pads 286, 287, 288 on assembled circuit board 172 while the short leg 282 is used to contact with a momentary pad 289 on assembled circuit board 172. A ring-shaped latch pad 290 is placed in the middle of the assembled circuit board 172. In the present embodiment, the momentary pad 289 has a shorter distance from the center of assembled circuit board 172 than other three pads have.

When switch cover 200 is not depressed, short leg 282 is not in contact with any portions on assembled circuit board 172. In this situation, both latch pad 290 and momentary pad 289 on assembled circuit board 172 are not in contact with ground pads 286, 287, 288 on assembled circuit board 172.

When switch cover 200 is depressed half way down, actuator 168 pushes snap dome 170 toward assembled circuit board 172. In this situation, Short leg 282 is contacting to momentary pad 289 while the central body of snap dome 170 is not contacting with latch pad 290 of assembled circuit board 172. Since the whole snap dome 170 is made of metal, the momentary pad 289 is now connecting to ground while the latch pad 290 is not.

When switch cover 200 is further depressed, actuator 168 pushes snap dome 170 further down until snap dome 170 collapse such that the body of snap dome 170 is in contact with latch pad 290. Now, not only momentary pad 289 is connecting to ground, latch pad 290 is also connecting to ground.

The condition whether momentary pad 289 or latch pad 290 is connecting to ground are received as signals to the assembled circuit board 172, which in turn passes or disrupts the energy flow from the batteries in the battery compartment 199 to the aft end of inner contact sleeve 162. In this way, head and switch assembly 106 can turn the flashlight 100 on or off. The assembled circuit board 172 may additionally include circuitry suitable for providing functions to the flashlight 100 which will be described in more detail later.

Snap in contact 174 is configured to include curved springs or biasing elements such that the assembled circuit board 172 is protected by the spring force generated by snap in contact 174 from, for example, batteries shifting and pressing on the main switch housing 176. In this way, an effective electrical connection can be maintained by the biasing elements while protecting sensitive components, such as the assembled circuit board 172.

Lower switch housing 178 is mounted with two L-shaped contacts 260, 262. L-shaped contact 260 is used to electrically contact with a positive contact of the assembled circuit board 172 while maintaining electrically contact with snap in contact 174. L-shaped contact 262 is used to electrically contact with another positive contact of the assembled circuit board 172 while maintaining electrically contact with the aft end of inner contact sleeve 162. In the present embodiment, once batteries are inserted into the battery compartment 199, the center electrode of the forward-most battery (not shown) is electrically coupled to the snap in contact 174, which is electrically coupled to the assembled circuit board 172, which in turn is electrically coupled to the aft end of inner contact sleeve 162.

Ground contact 184 is secured by hex nut 186 to electrically communicate with set screw 182, which in turn is electrically coupled to switch spring 180, which in turn is electrically coupled to a ground contact of the assembled circuit board 172.

When batteries (not shown) are installed into the battery compartment 199, in the present embodiment, an electrical current can flow from the center electrode of the forward-most battery to snap in contact 174, L-shaped contact 260, assembled circuit board 172, switch spring 180, set screw 182, barrel 198, tail cap 206, spring 202, and back to the case electrode of batteries. This electrical path provides electrical power to the components mounted on the assembled circuit board 172.

Electrical current can also flow from the center electrode of the forward-most battery to snap in contact 174, L-shaped contact 260, assembled circuit board 172, L-shaped contact 262, inner contact sleeve 162, spring 160, outer contact sleeve 158, contact disc 146, LED module 144, ball 142, ball housing 140, ground contact 184, set screw 182, barrel 198, tail cap 206, spring 202, and back to the case electrode of batteries. This electrical path provides electrical power to the LED 145 of LED module 144.

Figure 7:
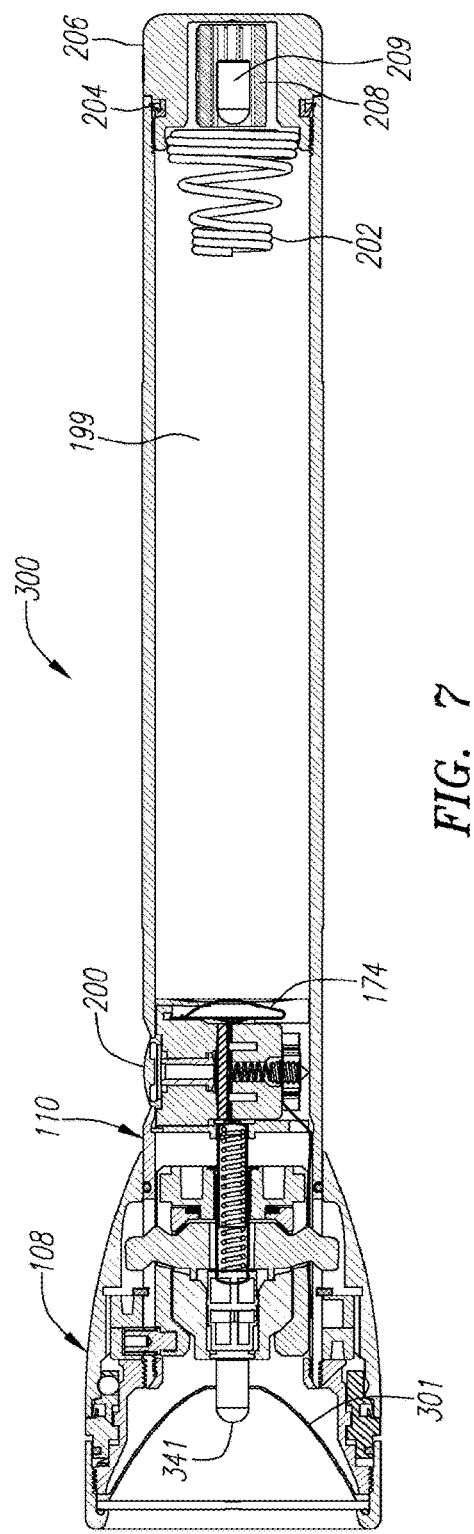
FIG. 7 is a cross-sectional view of a flashlight according to another embodiment of the present invention.

Referring to FIG. 7, flashlight 300 has similar construction as that of flashlight 100. The major difference is that, in flashlight 300, incandescent lamp is preferred. Also, a spare lamp holder 208 for holding a spare lamp 209 is inserted in tail cap 206.

Figure 8:
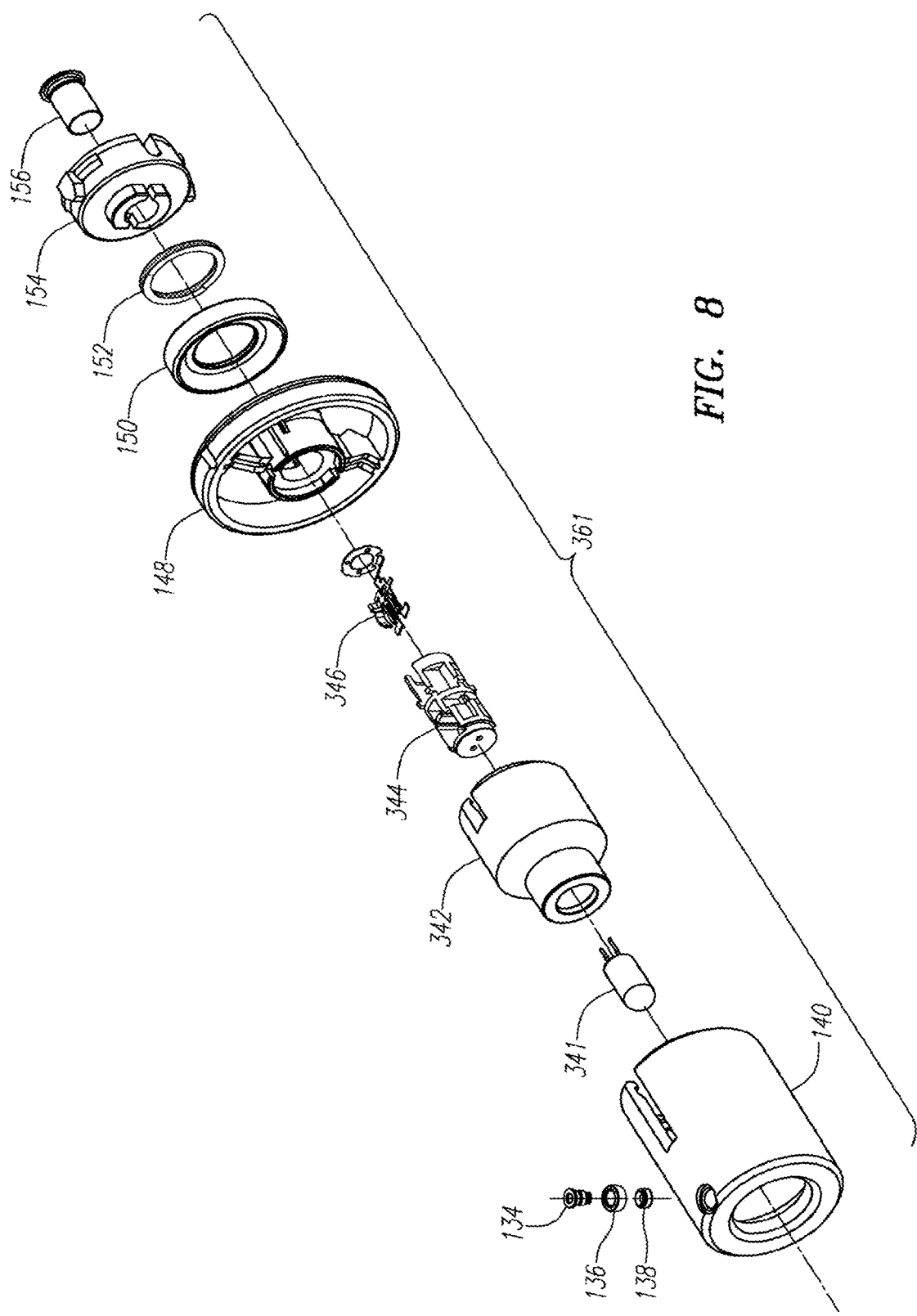
FIG. 8 is an exploded perspective view of the adjustable ball assembly portion of the flashlight of FIG. 7.

FIG. 8 is a partially exploded view of the flashlight of FIG. 7 showing an adjustable ball assembly portion 361 which is corresponding to the adjustable ball assembly portion 212 of flashlight 100 shown in FIG. 5B. According to the embodiment of FIG. 8, flashlight 300 has a ball 342 which can hold a contact holder 344. The front end of contact holder 344 can receive two conductive pins from a lamp 341. In the present embodiment, lamp 341 is a incandescent lamp. On the aft end of contact holder 344 is a lamp contact 346 which is integrally molded into contact holder 344 to form an assembly. The contact 346 serves the same function as the contact disc 146 of flashlight 100 that lamp contact 346 also forms a portion of an electric path between batteries (not shown) and lamp 341. Other components of the ball assembly portion 361 are similar to that in flashlight 100 and would not be described further.

Figure 9:
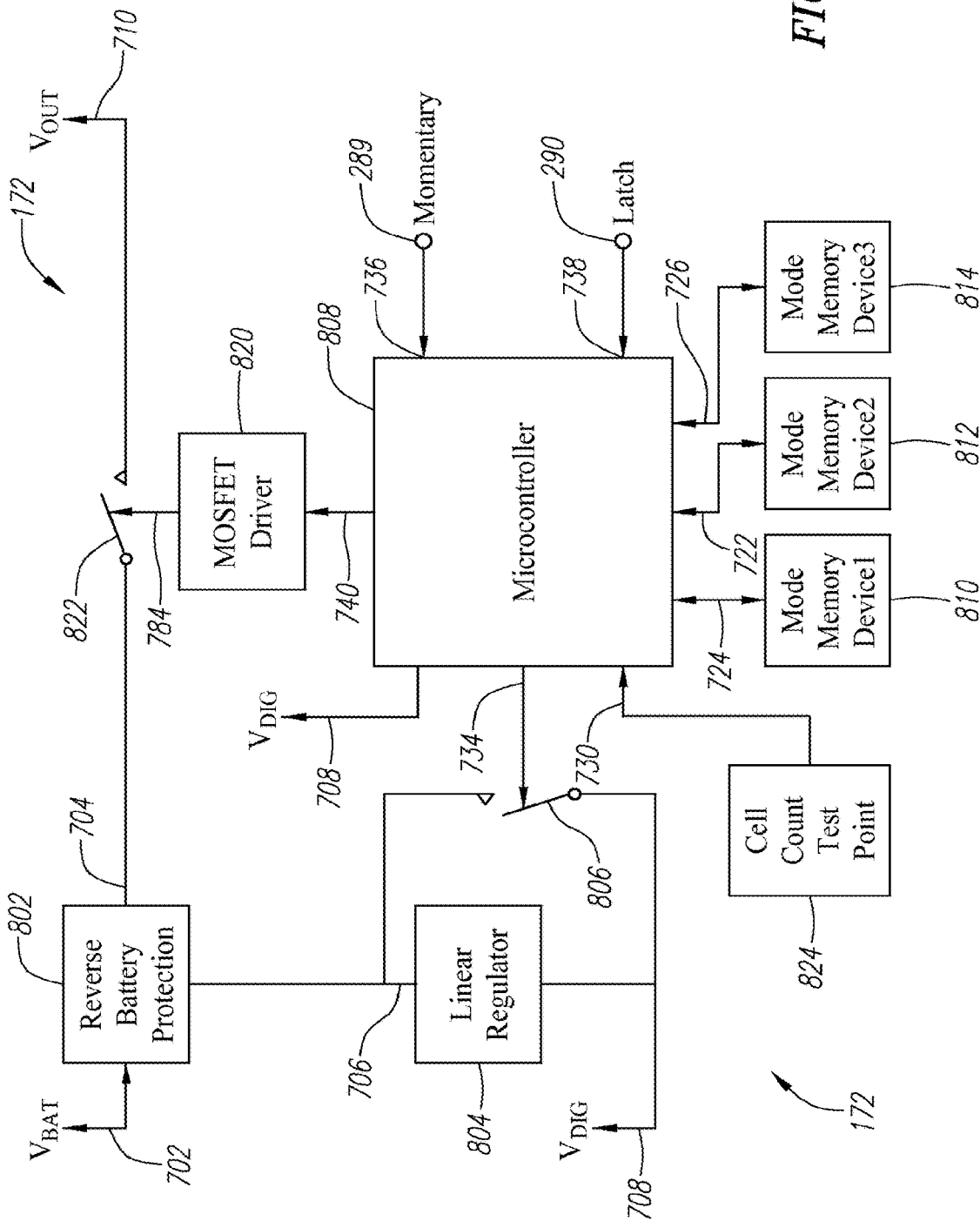
FIG. 9 is a circuit diagram illustrating the relationship of the electronic circuitry according to one embodiment of the invention.

Assembled circuit board 172 will now be described. For the purpose of simplification, assembled circuit board 172 is described in connection with flashlight 100. However, it is understandable that assembled circuit board 172 is also used in flashlights 300, 400, and 600. FIG. 9 is a block diagram illustrating the relationship of the electronic circuitry of assembled circuit board 172. In the embodiment of FIG. 9, assembled circuit board 172 includes a microcontroller circuit 808, a reverse battery protection circuit 802, a linear regulator circuit 804, a first mode memory device 810, a second mode memory device 812, a third mode memory device 814, a bypass switch 806, a MOSFET driver 820, a load switch 822, a momentary pad 289, a latch pad 288, and a cell count test point 824.

Detailed electrical circuit schematics of assembled circuit board 172 are shown in FIGS. 10A-E.

Figure 10A:
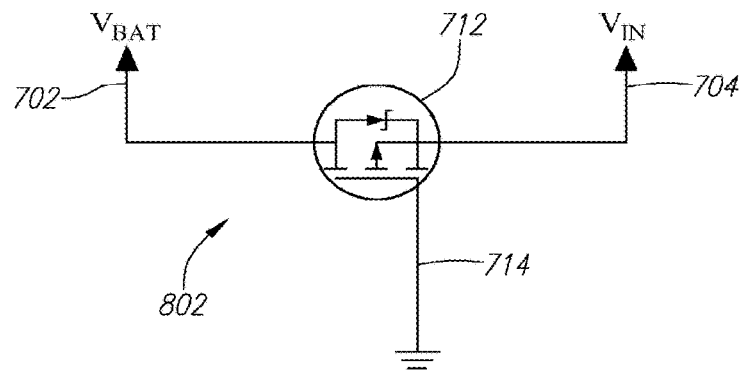
FIGS. 10A-E are schematic circuit diagrams of different components of the circuit shown in FIG. 9.

FIG. 10A shows a circuit schematic diagram of reverse battery protection circuit 802. The reverse battery protection circuit 802 takes the voltage 702 from the positive electrode of a battery of a battery pack and connects it to a source of a p-channel metal-oxide-semiconductor field-effect transistor (PMOS) 712. The gate of PMOS 712 is connected to ground 714 while the drain of PMOS 712 is connected to an internal voltage supply 704 for assembled circuit board 172. With this reverse battery protection circuit 802, when the battery or battery pack is installed in reverse order, no current will be flowed through current paths of the flashlights.

Figure 10B:
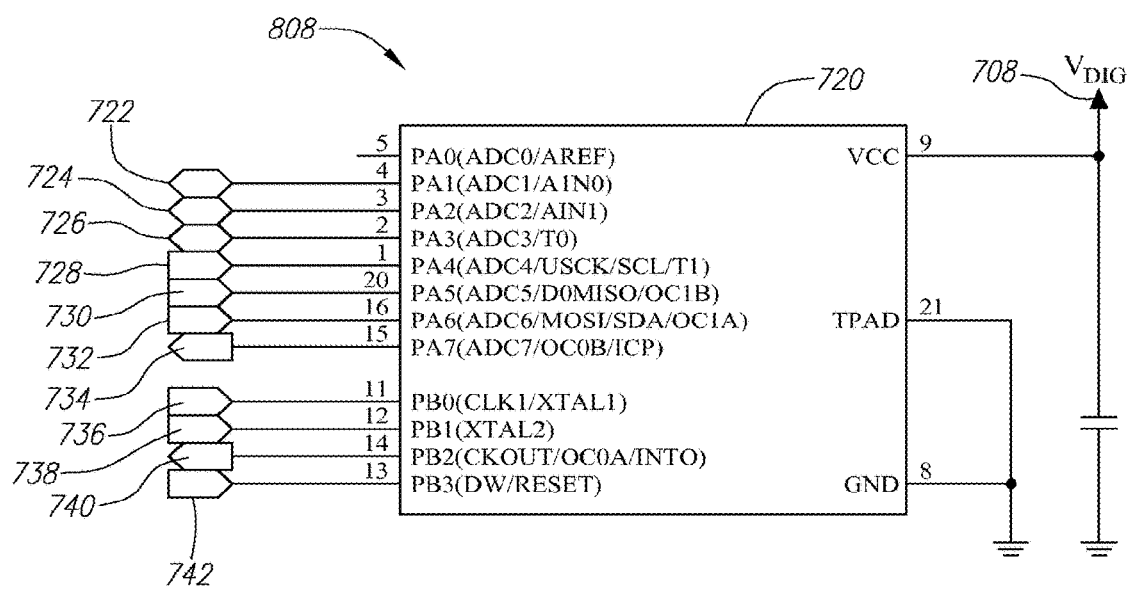

Referring to FIG. 10B, microcontroller circuit 808 includes a microcontroller 720 and connections. Microcontroller 720 receives input signals through signal lines ADC_MODE_CAP1 722, ADC_MODE_CAP2 724, ADC_MODE_CAP3 726, MISO 730, MOMENTARY_SWITCH 736, MAIN_SWITCH 738, and RESET 742. Microcontroller 720 also delivers output signals through signal lines ADC_MODE_CAP1 722, ADC_MODE_CAP2 724, ADC_MODE_CAP3 726, BYPASS_LDO 734, and LAMP_DRIVE 740. In accordance, signal lines ADC_MODE_CAP2 722, ADC_MODE_CAP1 724, ADC_MODE_CAP3 726 are bi-directional. In one embodiment, the microcontroller 720 is a commercial microcontroller having embedded memory, such as, for example, ATtiny24 which is an 8-bit microcontroller manufactured by Atmel Corporation of San Jose, Calif. In another embodiment, the microcontroller 720 can be a microprocessor. Yet in other embodiments, the microcontroller 720 can be discrete circuits.

Microcontroller 720 has a power supply source 708 to provide voltage input. Typically, microcontroller 720 can not accept a power supply source that is higher than a predefined value, for example, 5.5 volts. However, flashlights 100 and 300 can be adjusted to contain two, three or four batteries (depending on the length of barrel) that the battery voltage source 702 (and also 704) can range from 3.0 volts to 6.0 volts. If a flashlight is designed for using four batteries, voltage from the battery voltage source 702 cannot be used to supply the microcontroller 708 directly.

Figure 10C:
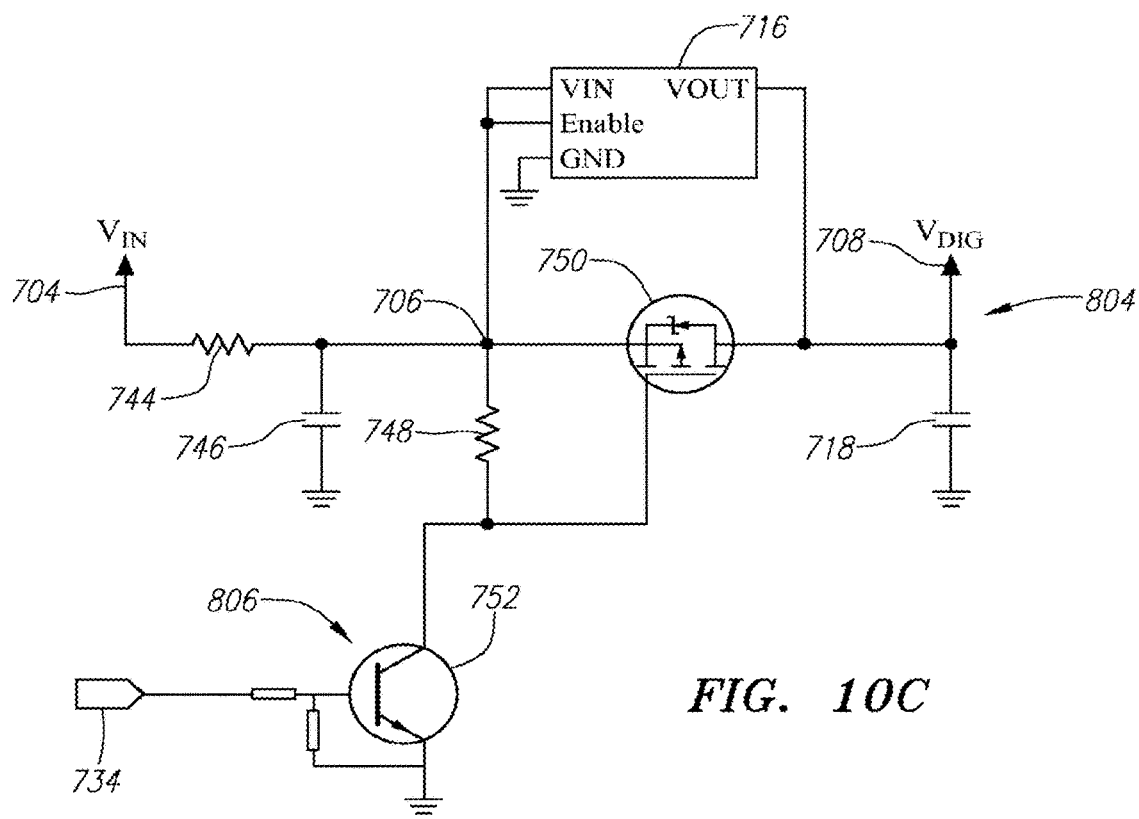

FIG. 10C shows a circuit schematic diagram of linear regulator circuit 804. The linear regulator circuit 804 takes the internal voltage supply 704 from reverse battery protection circuit 802 as input voltage and convert it into an digital voltage output source 708 for supplying the microcontroller 708 through two different paths. The first path is through a low drop-out (LDO) linear voltage regulator 716 and the second path is to bypass the LDO linear voltage regulator 716 and pass through a PMOS 750.

When flashlight 100 or 300 is designed for receiving four batteries, internal voltage supply 704 can not be used to supply microcontroller 720 directly. Signal line BYPASS_LDO 734 would be turned low by microcontroller 708. Thus, bipolar transistor 806 with built-in resistors would not be conduct. In accordance, PMOS 750 would not be conduct. Internal voltage supply 704 would be converted to digital voltage output source 708 through LDO linear voltage regulator 716 which would provide an output voltage source that is lower than the input voltage supply. In the present embodiment, the LDO linear voltage regulator 716 would drop the input voltage for about 1.0 volt.

When flashlight 100 or 300 is designed for receiving two or three batteries, or if flashlights 400, 600 with battery pack are used, internal voltage supply 704 could be used to supply microcontroller 720 directly. Signal line BYPASS_LDO 734 could be turned high by microcontroller 708. In this situation, bipolar transistor 806 with built-in resistors would be conduct, and therefore, PMOS 750 would be conduct. Internal voltage supply 704 would now be converted to digital voltage output source 708 through PMOS 750 and bypass the LDO linear voltage regulator 716.

In the embodiment of FIG. 10C, internal voltage supply 704 may be coupled to digital voltage source 708 first through a resistor 744 before passing through the LDO linear voltage regulator 716 or the PMOS 750. Resistor 744 and capacitor 746 constitute a RC filter that filters out noises, for example, noise due to the switching of PMOS 780 (see FIG. 10D). This RC filter helps reduce errors when microcontroller 720 is making analog-to-digital conversions. In the present embodiment, resistor 744 may be set at 18 Ohms, for example, while capacitor 746 may be set at 1.0 micro Farad, for example.

Microcontroller 720 can be programmed during manufacturing of flashlight to put the number of battery cell information through cell count test point 824 (shown in FIG. 9) to decide whether to turn signal line BYPASS_LDO 734 high or low. This battery cell count information is also stored in an embedded non-volatile memory, such as EEPROM, of microcontroller 720 for calculating power profile which will be described in more detail.

Figure 10D:
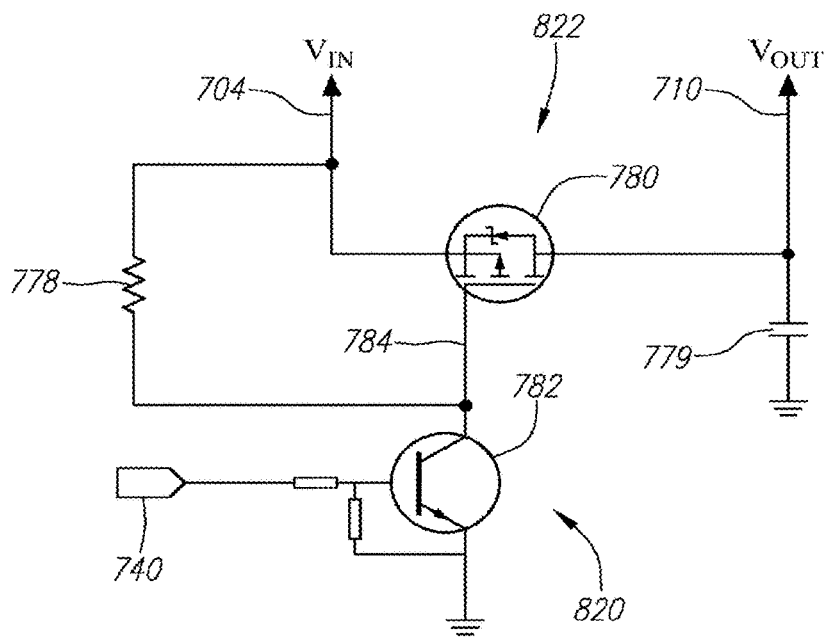

FIG. 10D shows a circuit schematic diagram of MOSFET driver circuit 820 and a load switch 822. In the embodiment of FIG. 10D, load switch 822 is implemented by a PMOS 780 that the source of PMOS 780 is coupled to internal voltage supply 704 while the drain of PMOS 780 is coupled to voltage output pin 710. Voltage output pin 710 can be coupled to the positive electrode of the LED 145 of flashlight 100. The gate of PMOS 780 is coupled to a MOSFET driver 820, which is implemented by a bipolar transistor 782. The gate of PMOS 780 is also pulled-up to internal voltage supply 704 by a resistor 778. In accordance, when the base of bipolar transistor 782 is driven high by signal LAMP_DRIVE 740, bipolar transistor 782 is conduct and so is PMOS 780. Therefore, electric power can flow from internal voltage supply 704 to voltage output pin 710 to form a portion of a complete loop of electric current path that can turn the LED 145 on.

In the present embodiments, as long as the batteries or battery pack is installed and the connecting parts are working, the assembled circuit board 172 is supported by power from the batteries or battery pack regardless whether the flashlight 100 is switch on or switched off. Microcontroller 720 by default is in a very low power stand-by mode to minimize drain on the batteries. When momentary pad 289 is grounded by snap dome 170, microcontroller 720 will wake up from low power stand-by mode and turn on a load switch 780, which turns on the LED 145 of the flashlight 100. As long as momentary pad 289 is grounded, the LED 145 will be on full power. Once the switch button 200 is released and momentary pad 289 is no longer grounded, microcontroller 720 will turn off load switch 780 and the LED 145 will be off. Microcontroller 720 will then go back to low power stand-by mode.

Figure 10E:
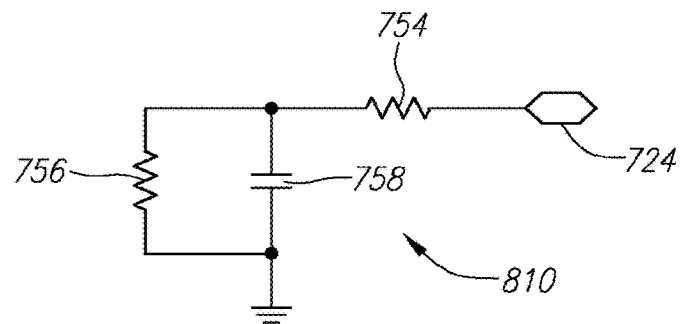
Figure 10E:
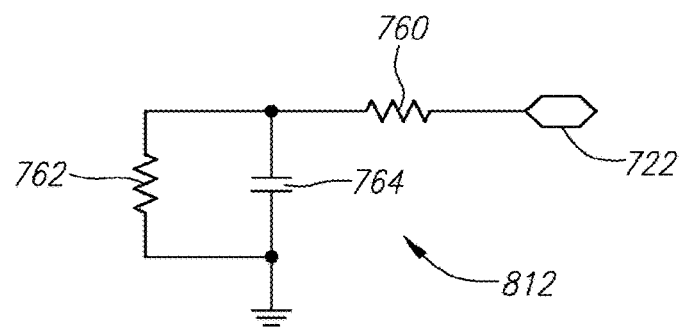
Figure 10E:
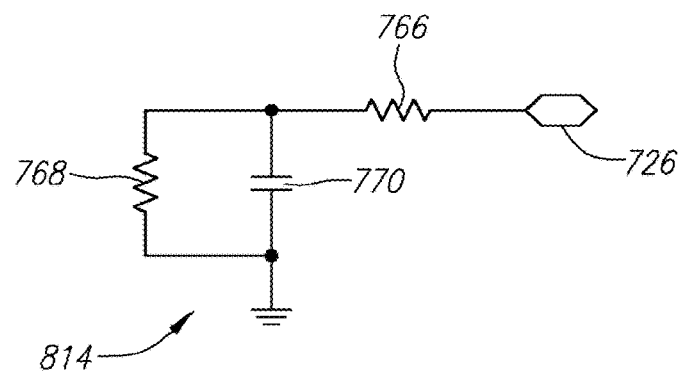

If switch button 200 is pressed further that both momentary pad 289 latch pad 288 are grounded, the LED 145 will stay on until another full press is detected Referring to FIG. 10E, the three mode memory devices 810, 812, 814 will now be described together. The first mode memory device 810 has an input/output signal line ADC_MODE_CAP1 724 to be coupled to microcontroller 720. Signal line ADC_MODE_CAP1 724 is also coupled to one end of resistor 754. The other end of resistor 754 is coupled to a RC circuit with resistor 756 and capacitor 758 connected in parallel. The other end or the RC circuit is coupled to ground. This first mode memory device 810 can be used to store information in a temporary manner. Microcontroller 720 can store an information in mode memory device 810 by setting signal line ADC_MODE_CAP1 724 to a high or a low. The high information would be store in the first mode memory device 810 for a short period of time, for example, 2 seconds, before it is decayed and cannot be recognized. Microcontroller 720 can execute a read operation from signal line ADC_MODE_CAP1 724 to retrieve data value stored in the first mode memory device 810. In the present embodiment, the resistance of resistor 756 is 1.0 Mega Ohms while the capacitance of capacitor 758 is 1.0 micro Farad. Similarly, the second mode memory device 812 and the third mode memory device 814 can have the same configuration as that of the first mode memory device 810.

In the present embodiments, flashlight 100 has eight modes of operation. When the flashlight is switched on, microcontroller 720 reads mode information from an internal memory, for example, an embedded SRAM built in the microcontroller 720. Microcontroller 720 increments the mode information by one to obtain a current mode information and stores the current mode information to the external mode memory devices 810, 812, 814. Flashlight 100 goes to the original mode of operation accordingly.

For example, when switch button 200 is hard pressed into latch position while flashlight 100 is in off mode, microcontroller 720 reads the previous mode information from the embedded SRAM. If the previous mode information is 0,0,0, microcontroller 720 increments it by one to obtain the current mode information, which is 0,0,1. In the present embodiment, a 0,0,1 mode information represent a full power mode. In accordance, flashlight 100 enters the full power mode. Microcontroller 720 then write the current mode information into the three mode memory devices 810, 812, 814 by pulling signal lines ADC_MODE_CAP3 726 and ADC_MODE_CAP2 722 to low and pulling signal line ADC_MODE_CAP1 724 to high.

While the flashlight 100 is in an operation mode other than off mode, if the switch button 200 is hard pressed into latch position (both momentary pad 289 and latch pad 288 are grounded), and hold it for a period of time, for example, two seconds, in the present embodiment, microcontroller 720 interprets that as a command to change mode of operation. Microcontroller 720 reads the previous mode information from the embedded SRAM and increments it by one to obtain the current mode information. If the previous mode information is 0,0,1, for example, then the current mode information would be 0,1,0. Microcontroller 720 then writes the current mode information into the three mode memory devices 810, 812, 814 by pulling signal lines ADC_MODE_CAP3 726 and ADC_MODE_CAP1 724 to low and pulling signal line ADC_MODE_CAP2 722 to high. In the present embodiment, this 0,1,0 combination represents a 50% power save mode.

In the present embodiment, the 0,1,1 combination stored in the three mode memory devices 810, 812, 814 represents that the current mode is a 25% Power Save mode. The rest of the operation modes for flashlight 100 are shown in Table 1.

TABLE 1

Operation Modes and Code

| Mode Name | Current Mode | Next Mode |
|---|---|---|
| Off | 0, 0, 0 | 0, 0, 1 |
| Full Power | 0, 0, 1 | 0, 1, 0 |
| 50% Power Save | 0, 1, 0 | 0, 1, 1 |
| 25% Power Save | 0, 1, 1 | 1, 0, 0 |
| 10% Power Save | 1, 0, 0 | 1, 0, 1 |
| Blink | 1, 0, 1 | 1, 1, 0 |
| Beacon | 1, 1, 0 | 1, 1, 1 |
| SOS | 1, 1, 1 | 1, 1, 1 |

As long as the user continues to hold the switch 200 in the latch position, the flashlight 100 will make a transition through the lists of modes above. Every time a determined period of time, for example, two seconds, has passed, the mode count will be incremented.

Flashlight 100 may face a power interruption while the flashlight 100 is turned on or turned off. For example, when there is a need for battery replacement, flashlight 100 (and also the microcontroller 720) could experience a relatively long period of power interruption. When the flashlight is accidentally dropped on the ground or hit to a hard surface from one end of its ends, the inertia of the batteries or battery pack could cause the batteries or battery pack to disconnect from one of the battery contacts for a short period of time and that causes a short period of power interruption.

In the present embodiment, after flashlight 100 has experienced a power interruption, no matter it is a relatively long period or a short period, when the power turned back on, microcontroller 720 runs a powered up routine, which includes a read from the three mode memory devices 810, 812, 814 through signal lines ADC_MODE_CAP3 726, ADC_MODE_CAP2 722, ADC_MODE_CAP1 724. Accordingly, flashlight 100 enters the mode information indicated by the mode memory devices 810, 812, 814.

For example, after a battery replacement, the mode information indicated by the mode memory devices 810, 812, 814 should be 0,0,0 since charges stored on capacitors 758, 764, 770 should have been decade. Microcontroller 720 then reads from the three mode memory devices 810, 812, 814 and obtains 0,0,0 as previous mode information. Accordingly, flashlight 100 enters the off mode.

On the other hand, if the flashlight is accidentally dropped on the ground or hit to a hard surface from one end of its ends, the inertia of the batteries or battery pack could cause the batteries or battery pack to disconnect from one of the battery contacts for a short period of time and that causes a short period of power interruption, typically shorter than 0.5 seconds. If the mode of operation right before the accident is, for example, the SOS mode, the charges stored on capacitors 758, 764, 770 are still retained as it is before the accident after the reconnection. Microcontroller 720 then reads from the three mode memory devices 810, 812, 814 and obtains 1,1,1 as previous mode information. Accordingly, flashlight 100 enters the SOS mode which is the operating mode before the accident. In other words, the flashlight 100 has immunity from such accident.

The power immunity from interruption of flashlight 100 also applies to the condition when the flashlight 100 is in the off mode. When the flashlight 100 is switched off, microcontroller 720 write 0,0,0 to the three mode memory devices 810, 812, 814, and microcontroller 720 enters a low power stand-by mode. Therefore, regardless of a short power interruption or a long power interruption, after the power connection is restored, microcontroller 720 reads from the three mode memory devices 810, 812, 814 and obtains 0,0,0 as previous mode information. Accordingly, flashlight 100 enters the off mode.

The electronic switch supplies power to LED 145 at different duty cycles to maximize battery life. Microcontroller 720 including an internal memory for storing data battery count information and the power profile information for a variety of batteries that can be installed to flashlight 100. For most of the battery life, electronic switch 822 provides full power (100% duty cycle) to LED 145. As the batteries deplete, battery voltage 702 will drop and this is monitored by microcontroller 720. Microcontroller 720 uses the power profile for each battery to decide when to reduce the duty cycle and when to keep.

Figure 11A:
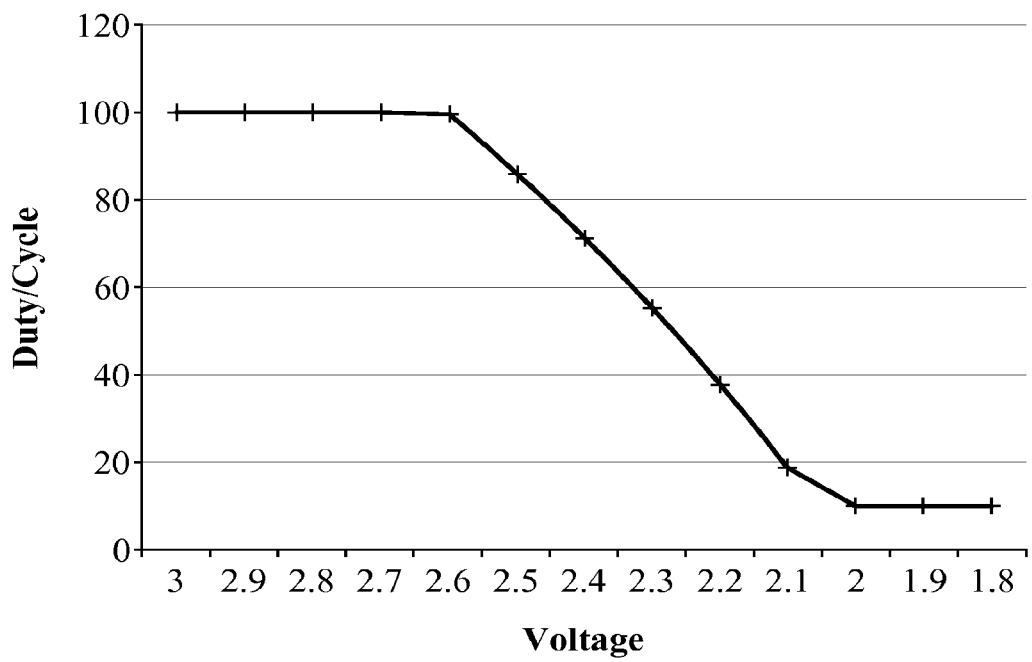
FIGS. 11A-C are diagrams of the power profile for different types of batteries.
Figure 11B:
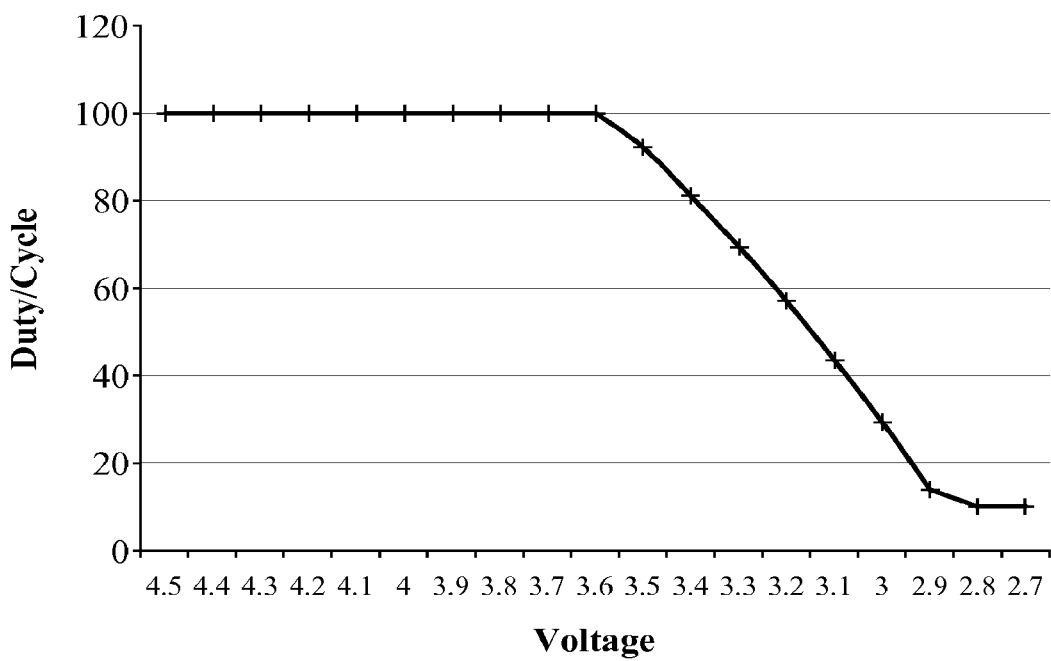
Figure 11C:
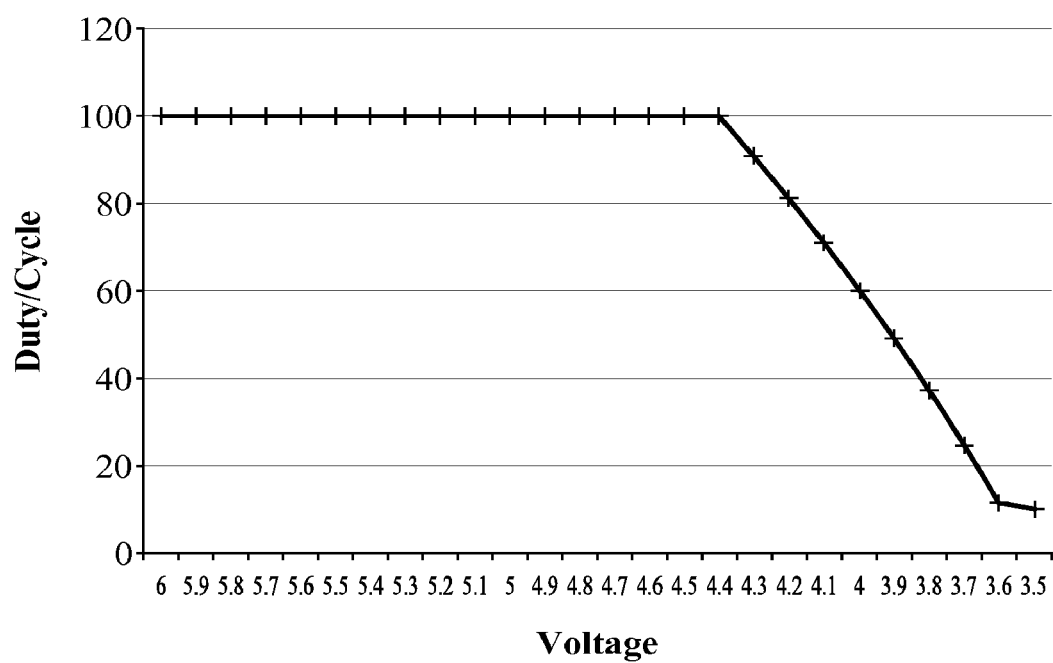

Each battery has limited life cycle including a high voltage period, a voltage depletion period and a low voltage period. When battery voltage 702 is in the high voltage period, microcontroller 720 provides a high duty cycle signal to the lamp drive output pin 740 for MOSFET driver 820 to provide a high duty cycle power supply 710 to LED 145. When battery voltage 702 is in the voltage depletion period, the microcontroller 720 gradually declines the duty cycle signal to the lamp drive output pin 740 for MOSFET driver 820 to provide a gradually declined power supply 710 to LED 145. When battery voltage 702 is in the low voltage period, microcontroller 720 provides a low duty cycle signal to the lamp drive output pin 740 for MOSFET driver 820 to provide a low duty cycle power supply 710 to LED 145. FIG. 11A is a power profile for two cell batteries. FIG. 11B is a power profile for three cell batteries. FIG. 11C is a power profile for four cell batteries. By reducing duty cycle towards the end of batteries' life, the usable time of batteries can be significantly extended.

While various embodiments of an improved flashlight and its respective components have been presented in the foregoing disclosure, numerous modifications, alterations, alternate embodiments, and alternate materials may be contemplated by those skilled in the art and may be utilized in accomplishing the various aspects of the present invention. For example, the power control circuit and short protection circuit described herein may be employed together in a flashlight or may be separately employed. Further, the short protection circuit may be used in rechargeable electronic devices other than flashlights. Thus, it is to be clearly understood that this description is made only by way of example and not as a limitation on the scope of the invention as claimed below.

What is claimed is:

1. A method for increasing battery life in a lighting device powered by a battery source through an electronic circuit, comprising: causing the electronic circuit to provide a declining power supply to a light emitting diode ("LED") as a power profile of the battery source declines.

2. The method of claim 1 wherein electronics use a power profile for the battery source and a measured battery voltage of the battery source to determine when a duty cycle of the electronic circuit is reduced.

3. The method of claim 2 wherein the duty cycle is reduced towards an end of life of the battery source.

4. The method of claim 3 wherein the duty cycle gradually declines when the end of life of the battery source is reached.

5. The method of claim 4 wherein the end of life of the battery source is a low voltage for the measured battery voltage.

6. The method of claim 1 wherein electronics use a power profile for the battery source and a measured battery voltage of the battery source to determine when a duty cycle of the electronic switch is reduced to extend battery life of the battery source.

7. The method of claim 6 wherein the duty cycle is reduced towards an end of life of the battery source.

8. The method of claim 7 wherein the duty cycle gradually declines when the end of life of the battery source is reached.

9. The method of claim 8 wherein the end of life of the battery source is a low voltage for the measured battery voltage.

10. A lighting apparatus with a light emitting diode (LED) light source powered by a battery source through an electrical circuit, comprising:
electronics for causing the electronic circuit to provide a declining power supply to the LED light source as a power profile of the battery source declines.

11. The lighting apparatus of claim 10 wherein the electronics use a power profile for the battery source and a measured battery voltage of the battery source to determine when a duty cycle of the electronic circuit is reduced to extend battery life of the battery source.

12. The lighting apparatus of claim 11 wherein the duty cycle is reduced towards an end of life of the battery source.

13. The lighting apparatus of claim 12 wherein the duty cycle gradually declines when the end of life of the battery source is reached.

14. The lighting apparatus of claim 13 wherein the end of life of the battery source is a low voltage for the measured battery voltage.

15. The lighting apparatus of claim 10 wherein the electronics use a power profile for the battery source and a measured battery voltage of the battery source to determine when a duty cycle of the electronic circuit is reduced to extend battery life of the battery source.

16. The lighting apparatus of claim 15 wherein the duty cycle is reduced towards an end of life of the battery source.

17. The lighting apparatus of claim 16 wherein the duty cycle gradually declines when the end of life of the battery source is reached.

18. The lighting apparatus of claim 17 wherein the end of life of the battery source is a low voltage for the measured battery voltage.

* * * * *